(12) United States Patent
Levy et al.

(10) Patent No.: US 10,263,087 B2
(45) Date of Patent: Apr. 16, 2019

(54) NONVOLATILE CHARGE TRAP MEMORY DEVICE HAVING A DEUTERATED LAYER IN A MULTI-LAYER CHARGE-TRAPPING REGION

(71) Applicant: Cypress Semiconductor Corporation, San Jose, CA (US)

(72) Inventors: Sagy Levy, Zichron Yaakov (IL); Fredrick Jenne, Mountain House, CA (US); Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/653,102

(22) Filed: Jul. 18, 2017

(65) Prior Publication Data
US 2017/0352732 A1    Dec. 7, 2017

Related U.S. Application Data

(63) Continuation of application No. 15/189,547, filed on Jun. 22, 2016, now Pat. No. 9,741,803, which is a
(Continued)

(51) Int. Cl.
*H01L 29/06* (2006.01)
*H01L 29/66* (2006.01)
(Continued)

(52) U.S. Cl.
CPC ...... *H01L 29/408* (2013.01); *H01L 21/28282* (2013.01); *H01L 29/04* (2013.01);
(Continued)

(58) Field of Classification Search
CPC . H01L 29/408; H01L 29/7926; H01L 29/513; H01L 29/66833; H01L 29/792;
(Continued)

(56) References Cited

U.S. PATENT DOCUMENTS

| 4,667,217 A | 5/1987 | Janning |
| 4,870,470 A | 9/1989 | Bass et al. |

(Continued)

FOREIGN PATENT DOCUMENTS

| CN | 101636845 A | 1/2010 |
| CN | 101859702 A | 10/2010 |

(Continued)

OTHER PUBLICATIONS

Kapoor et al. Chemical Composition, Charge Trapping, and Memory Properties of Oxynitride Films for MNOS Devices. Abstract. J. Electrochem. Soc. 137 (1990) 11.*

(Continued)

*Primary Examiner* — Galina G Yushina

(57) ABSTRACT

A memory is described. Generally, the memory includes a number of non-planar multigate transistors, each including a channel of semiconducting material overlying a surface of a substrate and electrically connecting a source and a drain, a tunnel dielectric layer overlying the channel on at least three sides thereof, and a multi-layer charge-trapping region overlying the tunnel dielectric layer. In one embodiment, the multi-layer charge-trapping region includes a first deuterated layer overlying the tunnel dielectric layer and a first nitride-containing layer overlying the first deuterated layer. Other embodiments are also described.

17 Claims, 13 Drawing Sheets

Related U.S. Application Data continuation of application No. 13/539,459, filed on Jul. 1, 2012, now Pat. No. 9,716,153, which is a continuation-in-part of application No. 11/904,475, filed on Sep. 26, 2007, now Pat. No. 8,680,601.

(60) Provisional application No. 60/931,905, filed on May 25, 2007.

(51) Int. Cl.
| | |
|---|---|
| *H01L 29/40* | (2006.01) |
| *H01L 21/28* | (2006.01) |
| *H01L 29/51* | (2006.01) |
| *H01L 29/792* | (2006.01) |
| *H01L 29/78* | (2006.01) |
| *H01L 29/786* | (2006.01) |
| *H01L 29/04* | (2006.01) |
| *H01L 29/16* | (2006.01) |

(52) U.S. Cl.
CPC .......... *H01L 29/0676* (2013.01); *H01L 29/16* (2013.01); *H01L 29/513* (2013.01); *H01L 29/518* (2013.01); *H01L 29/66833* (2013.01); *H01L 29/785* (2013.01); *H01L 29/78696* (2013.01); *H01L 29/792* (2013.01); *H01L 29/7926* (2013.01)

(58) Field of Classification Search
CPC ... H01L 29/0676; H01L 29/518; H01L 29/04; H01L 29/16; H01L 29/785
See application file for complete search history.

(56) References Cited

U.S. PATENT DOCUMENTS

| | | | |
|---|---|---|---|
| 6,187,665 B1 | 2/2001 | Chetlur et al. | |
| 6,218,700 B1 | 4/2001 | Papadas | |
| 6,448,136 B1 | 9/2002 | Chang et al. | |
| 6,521,977 B1 | 2/2003 | Burnham et al. | |
| 6,670,241 B1 | 12/2003 | Kamal et al. | |
| 6,677,213 B1* | 1/2004 | Ramkumar | H01L 21/28176 257/E21.194 |
| 6,709,928 B1* | 3/2004 | Jenne | H01L 27/115 257/E21.679 |
| 6,768,160 B1 | 7/2004 | Li et al. | |
| 6,818,558 B1 | 11/2004 | Rathor et al. | |
| 6,884,681 B1 | 4/2005 | Kamal et al. | |
| 6,913,961 B2 | 7/2005 | Hwang | |
| 6,949,433 B1 | 9/2005 | Hidehiko et al. | |
| 7,042,054 B1 | 5/2006 | Ramkumar et al. | |
| 7,060,594 B2 | 6/2006 | Wang | |
| 7,646,056 B2 | 1/2010 | Choi et al. | |
| 9,716,153 B2* | 7/2017 | Levy | H01L 29/408 |
| 2003/0122204 A1 | 7/2003 | Nomoto et al. | |
| 2003/0222318 A1 | 12/2003 | Tanaka et al. | |
| 2004/0217433 A1 | 11/2004 | Yeo et al. | |
| 2004/0251487 A1 | 12/2004 | Wu et al. | |
| 2004/0251521 A1 | 12/2004 | Tanaka et al. | |
| 2004/0266117 A1 | 12/2004 | Hwang | |
| 2005/0062098 A1 | 3/2005 | Mahajani et al. | |
| 2005/0275010 A1 | 12/2005 | Chen et al. | |
| 2006/0192248 A1 | 8/2006 | Wang | |
| 2006/0234456 A1 | 10/2006 | Anderson et al. | |
| 2006/0258090 A1 | 11/2006 | Bhattacharyya et al. | |
| 2006/0267072 A1 | 11/2006 | Bhattacharyya | |
| 2006/0284236 A1 | 12/2006 | Bhattacharyya | |
| 2006/0292781 A1 | 12/2006 | Lee | |
| 2007/0272916 A1 | 11/2007 | Wang et al. | |
| 2008/0067577 A1 | 3/2008 | Wang et al. | |
| 2008/0087942 A1 | 4/2008 | Hsu et al. | |
| 2008/0191247 A1* | 8/2008 | Yin | H01L 21/8221 257/204 |
| 2008/0239818 A1 | 10/2008 | Mokhlesi et al. | |
| 2008/0277720 A1 | 11/2008 | Youn et al. | |
| 2008/0285350 A1 | 11/2008 | Yeh | |
| 2008/0290399 A1 | 11/2008 | Levy et al. | |
| 2009/0020831 A1 | 1/2009 | Ramkumar et al. | |
| 2009/0096017 A1 | 4/2009 | Lai et al. | |
| 2009/0101965 A1 | 4/2009 | Chen et al. | |
| 2009/0179253 A1 | 7/2009 | Levy et al. | |
| 2010/0178759 A1 | 7/2010 | Kim et al. | |
| 2011/0012090 A1* | 1/2011 | Singh | B82Y 10/00 257/24 |
| 2013/0107628 A1* | 5/2013 | Dong | G11C 16/0483 365/185.17 |
| 2013/0306975 A1 | 11/2013 | Levy et al. | |
| 2014/0264550 A1 | 9/2014 | Levy et al. | |

FOREIGN PATENT DOCUMENTS

| | | |
|---|---|---|
| TW | 540086 | 7/2003 |
| TW | 200905867 A | 2/2009 |

OTHER PUBLICATIONS

USPTO Advisory Action for U.S. Appl. No. 14/225,152 dated Nov. 2, 2017; 7 pages.
International Search Report for International Application No. PCT/US07/20965 dated Apr. 21, 2008; 2 pages.
International Search Report for International Application No. PCT/US2013/048870 dated Jun. 12, 2013; 2 pages.
Perkins, et al., "Diffusion and Permeation of He, Ne, Ar, Kr, and D2 through Silicon Oxide Thin Films", The Journal of Chemical Physics, vol. 54, No. 4, Feb. 1971, pp. 1683-1694.
Resenman et al., "Deep Traps in Oxide-Nitride-Oxide Stacks Fabricated from Hydrogen and Deuterium Containing Procursors," Journal of Applied Physics, 99, 2006, pp. 023702-1-023702-5.
SIPO Office Action for Application No. 200780035965.2 dated Sep. 6, 2012; 3 pages.
SIPO Office Action for Application No. 200780035965.2 dated Nov. 12, 2010; 7 pages.
SIPO Office Action for Chinese Patent Application No. CN2013800456408 dated Jan. 13, 2017; 8 pages.
Taiwanese Office Action for Application No. 096136678 dated May 21, 2014; 2 pages.
Taiwanese Office Action for Application No. 096136678.0 dated Jul. 30, 2013; 3 pages.
TIPO Office Action for International Application No. 102123445 dated Jan. 10, 2017; 11 pages.
TIPO Office Action for Taiwan Application No. 104101261 dated Dec. 11, 2015; 2 pages.
USPTO Advisory Action for U.S. Appl. No. 11/904,475 dated Mar. 27, 2013; 5 pages.
USPTO Advisory Action for U.S. Appl. No. 11/904,475 dated Nov. 15, 2011; 3 pages.
USPTO Advisory Action for U.S. Appl. No. 11/904,475 dated Nov. 24, 2010; 3 pages.
USPTO Advisory Action for U.S. Appl. No. 13/539,459 dated Mar. 20, 2014; 5 pages.
USPTO Final Rejection for U.S. Appl. No. 11/904,475 dated Jan. 9, 2013; 18 pages.
USPTO Final Rejection for U.S. Appl. No. 11/904,475 dated Sep. 6, 2011; 16 pages.
USPTO Final Rejection for Application No. 11/904,475 dated Sep. 28, 2010; 14 pages.
USPTO Final Rejection for U.S. Appl. No. 13/539,459 dated Dec. 24, 2013; 33 pages.
USPTO Final Rejection for U.S. Appl. No. 14/255,152 dated Sep. 13, 2016; 11 pages.
USPTO Non Final Rejection for U.S. Appl. No. 11/904,475 dated Apr. 12, 2011; 14 pages.
USPTO Non Final Rejection for U.S. Appl. No. 11/904,475 dated Apr. 27, 2010; 12 pages.
USPTO Non Final Rejection for U.S. Appl. No. 13/539,459 dated Jul. 15, 2013; 17 pages.

(56) References Cited

OTHER PUBLICATIONS

USPTO Non-Final Rejection for U.S. Appl. No. 11/904,475 dated Sep. 4, 2012; 16 pages.
USPTO Non-Final Rejection for U.S. Appl. No. 11/904,475 dated Sep. 9, 2013; 21 pages.
USPTO Non-Final Rejection for U.S. Appl. No. 13/539,459 dated Mar. 5, 2015; 37 pages.
USPTO Non-Final Rejection for U.S. Appl. No. 13/539,459 dated Jun. 30, 2016; 19 pages.
USPTO Non-Final Rejection for U.S. Appl. No. 13/539,459 dated Oct. 27, 2015; 13 pages.
USPTO Non-Final Rejection for U.S. Appl. No. 14/225,152 dated Apr. 13, 2017; 15 pages.
USPTO Non-Final Rejection for U.S. Appl. No. 14/225,152 dated Oct. 15, 2015; 18 pages.
USPTO Non-Final Rejection for U.S. Appl. No. 14/255,152 dated May 25, 2016; 15 pages.
USPTO Non-Final Rejection for U.S. Appl. No. 15/189,547 dated Dec. 23, 2016; 11 pages.
USPTO Notice of Allowance for U.S. Appl. No. 11/904,475 dated Dec. 23, 2013; 10 pages.
USPTO Notice of Allowance for U.S. Appl. No. 13/539,459 dated Feb. 4, 2016; 10 pages.
USPTO Notice of Allowance for U.S. Appl. No. 13/539,459 dated Jun. 25, 2015; 8 pages.
USPTO Notice of Allowance for U.S. Appl. No. 13/539,459 dated Sep. 20, 2016; 8 pages.
USPTO Notice of Allowance for U.S. Appl. No. 14/225,152 dated Jan. 1, 2016; 12 pages.
USPTO Notice of Allowance for Application No. 14/225,152 dated Apr. 1, 2015; 11 pages.
USPTO Notice of Allowance for U.S. Appl. No. 14/225,152 dated Nov. 10, 2016; 10 pages.
USPTO Notice of Allowance for U.S. Appl. No. 13/539,459 dated Mar. 21, 2017; 22 pages.
USPTO Notice of Allowance for U.S. Appl. No. 15/189,547 dated Apr. 14, 2017; 11 pages.
USPTO Requirement for Restriction Election for U.S. Appl. No. 14/225,152 dated Jan. 15, 2015; 15 pages.
USPTO Requirement for Restriction Election for U.S. Appl. No. 15/189,547 dated Oct. 12, 2016; 7 pages.
USPTO Requirement for Restriction for U.S. Appl. No. 11/904,475 dated Jan. 8, 2010; 8 pages.
USPTO Requirement for Restriction for U.S. Appl. No. 13/539,459 dated May 6, 2013; 6 pages.
Written Opinion of the International Searching Authority for International Application No. PCT/US07/20965 dated Apr. 21, 2008; 6 pages.
Written Opinion of the International Searching Authority for International Application No. PCT/US13/48870 dated Dec. 6, 2013; 6 pages.
USPTO Final Rejection for U.S. Appl. No. 14/225,152 dated Sep. 1, 2017; 17 pages.
USPTO Non-Final Rejection for U.S. Appl. No. 14/225,152 dated Jan. 11, 2018; 21 pages.
USPTO Notice of Allowance for U.S. Appl. No. 14/225,152 dated May 18, 2018; 9 pages.

\* cited by examiner

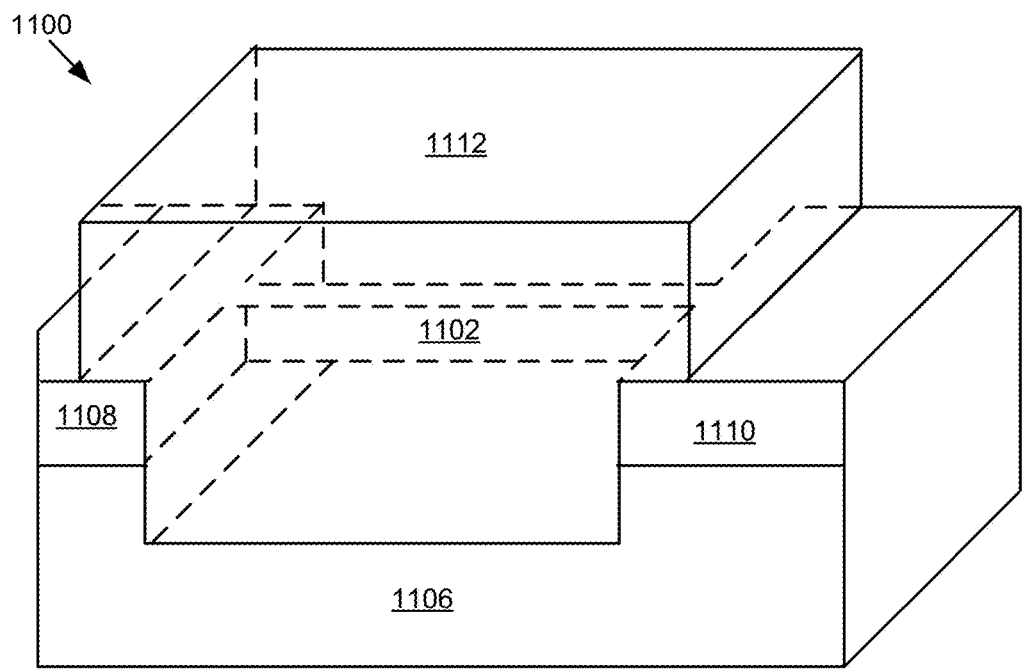
FIG. 11A
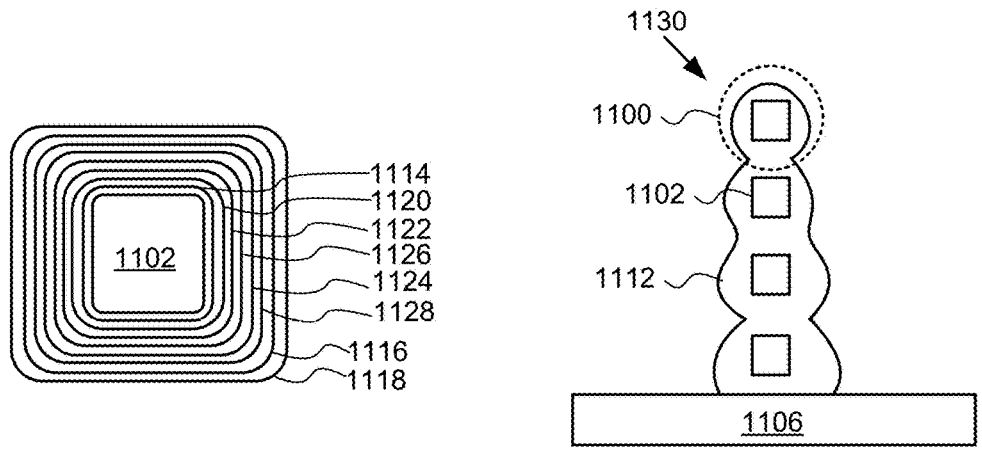
FIG. 11B  FIG. 11C

NONVOLATILE CHARGE TRAP MEMORY DEVICE HAVING A DEUTERATED LAYER IN A MULTI-LAYER CHARGE-TRAPPING REGION

CROSS-REFERENCE TO RELATED APPLICATIONS

This application is a continuation of co-pending U.S. application Ser. No. 15/189,547, filed Jun. 22, 2016, which is a continuation of co-pending U.S. application Ser. No. 13/539,459, filed Jul. 1, 2012, which is a continuation-in-part of U.S. application Ser. No. 11/904,475, filed Sep. 26, 2007, now U.S. Pat. No. 8,680,601 issued Mar. 25, 2014, which claims the benefit of priority under 35 U.S.C. 119(e) to U.S. Provisional Patent Application Ser. No. 60/931,905, filed May 25, 2007, all of which are incorporated by reference herein.

TECHNICAL FIELD

The invention is in the field of Semiconductor Devices.

BACKGROUND

For the past several decades, the scaling of features in integrated circuits has been a driving force behind an ever-growing semiconductor industry. Scaling to smaller and smaller features enables increased densities of functional wlits on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Non-volatile semiconductor memories typically use stacked floating gate type field-effect-transistors. In such transistors, electrons are injected into a floating gate of a memory cell to be programmed by biasing a control gate and grounding a body region of a substrate on which the memory cell is formed. An oxide-nitride-oxide (ONO) stack is used as either a charge storing layer, as in a semiconductor-oxide-nitride-oxide semiconductor (SONOS) transistor, or as an isolation layer between the floating gate and control gate, as in a split gate flash transistor. FIG. 1 illustrates a cross-sectional view of a conventional nonvolatile charge trap memory device.

Referring to FIG. 1, semiconductor device 100 includes a SONOS gate stack 104 including a conventional ONO portion 106 formed over a silicon substrate 102. Semiconductor device 100 further includes source and drain regions 110 on either side of SONOS gate stack 104 to define a channel region 112. SONOS gate stack 104 includes a poly-silicon gate layer 108 formed above and in contact with ONO portion 106. Polysilicon gate layer 108 is electrically isolated from silicon substrate 102 by ONO portion 106. ONO portion 106 typically includes a tunnel oxide layer 106A, a nitride or oxynitride charge-trapping layer 106B, and a top oxide layer 106C overlying nitride or oxynitride layer 106B.

One problem with conventional SONOS transistors is the poor data retention in the nitride or oxy-nitride layer 106B that limits semiconductor device 100 lifetime and its use in several applications due to leakage current through the layer. One attempt to address this problem focused on the use of silicon-rich SONOS layers, which enable a large initial separation between program and erase voltages at the beginning of life but result a rapid deterioration of charge storing ability. Another attempt focused on oxygen-rich layers, which enable a reduced rate of deterioration of charge storing ability, but also reduce the initial separation between program and erase voltages. The effect of both of these approaches on data retention over time may be shown graphically. FIGS. 2 and 3 are plots of Threshold Voltage (V) as a function of Retention Time (Sec) for conventional nonvolatile charge trap memory devices.

Referring to FIG. 2, rapid deterioration of charge storing ability for a silicon-rich layer is indicated by the convergence of the programming threshold voltage (VTP) 202 and erase threshold voltage (VTE) 204 to a specified minimum 206. Referring to FIG. 3, a reduced separation between VTP 302 and VTE 304 is obtained for an oxygen-rich layer. As indicated by line 306, the overall useful lifetime of device is not appreciably extended by this approach.

BRIEF DESCRIPTION OF THE DRAWINGS

Embodiments of the present invention are illustrated by way of example, and not limitation, in the figures of the accompanying drawings in which:

FIGS. 11A and 11B illustrate a non-planar device including a split charge-trapping region and a horizontal nanowire channel.

FIG. 11C illustrates a cross-sectional view of a vertical stack of nonplanar devices of FIG. 11A.

DETAILED DESCRIPTION

A nonvolatile charge trap memory device and a method to form the same is described herein. In the following description, numerous specific details are set forth, such as specific dimensions, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is to be understood that the various embodiments shown in the Figures are illustrative representations and are not necessarily drawn to scale.

Disclosed herein is a nonvolatile charge trap memory device. The device may include a substrate having a channel region and a pair of source and drain regions. A gate stack may be formed above the substrate over the channel region and between the pair of source and drain regions. In one embodiment, the gate stack includes a multi-layer charge-trapping region having a first deuterated layer. The multi-layer charge-trapping region may further include a deuterium-free charge-trapping layer. Alternatively, the multi-layer charge-trapping region may include a partially deuterated charge-trapping layer having a deuterium concentration less than that of the first deuterated layer.

A nonvolatile charge trap memory device including a multi-layer charge trapping region having a deuterated layer may exhibit improved programming and erase speed and data retention. In accordance with an embodiment of the present invention, a deuterated layer is formed between the charge-trapping layer of the multi-layer charge trapping region and the tunnel dielectric layer. In one embodiment, the deuterated layer is essentially trap-free and mitigates hot electron degradation during erase and program cycles. By incorporating a trap-free layer between the tunnel dielectric layer and the charge-trapping layer of a multi-layer charge-trapping region, the Vt shift from erase and program cycles may be reduced and the retention may be increased. In accordance with another embodiment of the present invention, a second deuterated layer is also formed between the charge-trapping layer of the multi-layer charge-trapping region and a top dielectric layer of the gate stack.

Figure 1:
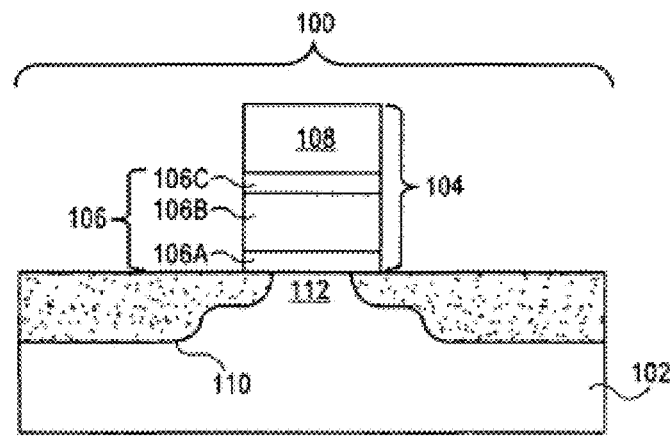
FIG. 1 illustrates a cross-sectional view of a conventional nonvolatile charge trap memory device.
Figure 2:
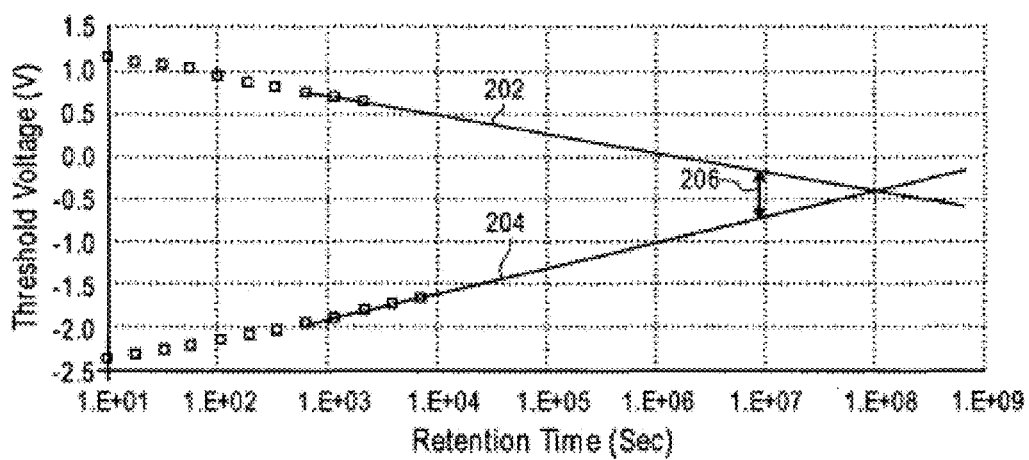
FIG. 2 is a plot of Threshold Voltage (V) as a function of Retention Time (Sec) for a conventional nonvolatile charge trap memory device.
Figure 3:
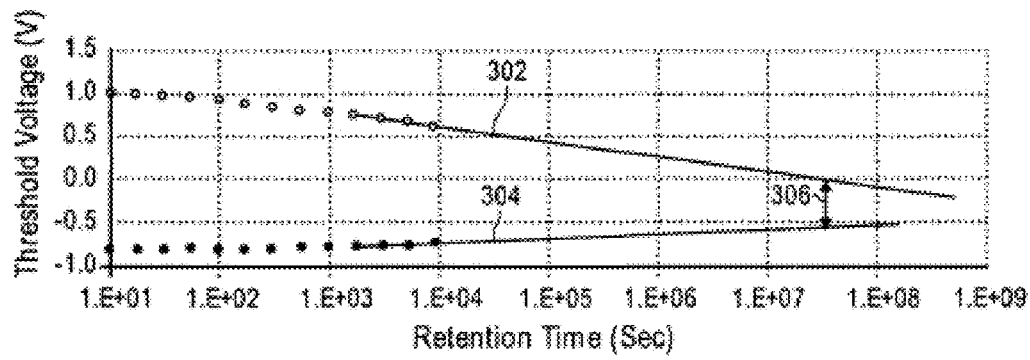
FIG. 3 is a plot of Threshold Voltage (V) as a function of Retention Time (Sec) for a conventional nonvolatile charge trap memory device.
Figure 4:
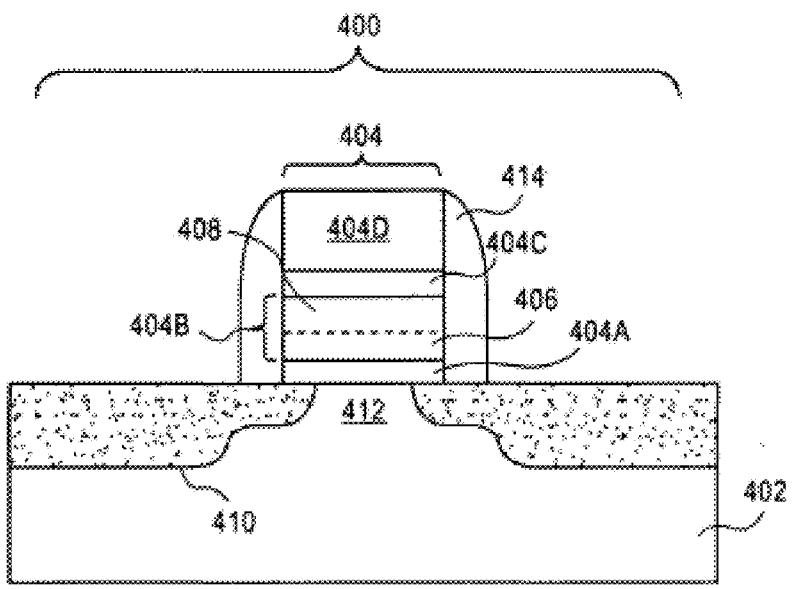
FIG. 4 illustrates a cross-sectional view of a nonvolatile charge trap memory device, in accordance with an embodiment of the present invention.

A nonvolatile charge trap memory device may include a multi-layer charge-trapping region having a deuterated layer. FIG. 4 illustrates a cross-sectional view of a nonvolatile charge trap memory device, in accordance with an embodiment of the present invention.

Referring to FIG. 4, semiconductor device 400 includes a gate stack 404 formed over a substrate 402. Semiconductor device 400 further includes source and drain regions 410 in substrate 402 on either side of gate stack 404, defining a channel region 412 in substrate 402 underneath gate stack 404. Gate stack 404 includes a tunnel dielectric layer 404A, a multi-layer charge-trapping region 404B, a top dielectric layer 404C and a gate layer 404D. Thus, gate layer 404D is electrically isolated from substrate 402. Multi-layer charge-trapping region 404B includes a deuterated layer 406 between a charge-trapping layer 408 of multi-layer charge-trapping region 404B and tunnel dielectric layer 404A. A pair of dielectric spacers 414 isolates the sidewalls of gate stack 404.

Semiconductor device 400 may be any nonvolatile charge trap memory device. In one embodiment, semiconductor device 400 is a Flash-type device wherein the charge-trapping layer is a conductor layer or a semiconductor layer. In accordance with another embodiment of the present invention, semiconductor device 400 is a SONOS-type device wherein the charge-trapping layer is an insulator layer. By convention, SONOS stands for "Semiconductor-Oxide-Nitride-Oxide-Semiconductor," where the first "Semiconductor" refers to the channel region material, the first "Oxide" refers to the tunnel dielectric layer, "Nitride" refers to the charge-trapping dielectric layer, the second "Oxide" refers to the top dielectric layer (also known as a blocking dielectric layer) and the second "Semiconductor" refers to the gate layer. A SONOS-type device, however, is not limited to these specific materials, as described below.

Substrate 402 and, hence, channel region 412, may be composed of any material suitable for semiconductor device fabrication. In one embodiment, substrate 402 is a bulk substrate composed of a single crystal of a material which may include, but is not limited to, silicon, germanium, silicon-germanium or a III-V compound semiconductor material. In another embodiment, substrate 402 includes a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. In another embodiment, substrate 402 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium and a III-V compound semiconductor material. The insulator layer is composed of a material which may include, but is not limited to, silicon dioxide, silicon nitride and silicon oxy-nitride. The lower bulk layer is composed of a single crystal which may include, but is not limited to, silicon, germanium, silicon-germanium, a III-V compound semiconductor material and quartz. Substrate 402 and, hence, channel region 412, may include dopant impurity atoms. In a specific embodiment, channel region 412 is doped P-type and, in an alternative embodiment, channel region 412 is doped N-type.

Source and drain regions 410 in substrate 402 may be any regions having opposite conductivity to channel region 412. For example, in accordance with an embodiment of the present invention, source and drain regions 410 are N-type doped regions while channel region 412 is a P-type doped region. In one embodiment~substrate 402 and, hence, channel region 412, is composed of boron-doped single-crystal silicon having a boron concentration in the range of $1 \times 10^{15}$-$1 \times 10^{19}$ atoms/cm$^3$. Source and drain regions 410 are composed of phosphorous- or arsenic-doped regions having a concentration of N-type dopants in the range of $5 \times 10^{16}$-$5 \times 10^{19}$ atoms/cm$^3$. In a specific embodiment, source and drain regions 410 have a depth in substrate 402 in the range of 80-200 nanometers. In accordance with an alternative embodiment of the present invention, source and drain regions 410 are P-type doped regions while channel region 412 is an N-type doped region.

Tunnel dielectric layer 404A may be any material and have any thickness suitable to allow charge carriers to tunnel into the charge-trapping layer under an applied gate bias while maintaining a suitable barrier to leakage when the device is unbiased. In one embodiment, tunnel dielectric layer 404A is formed by a thermal oxidation process and is composed of silicon dioxide or silicon oxy-nitride, or a combination thereof. In another embodiment, tunnel dielectric layer 404A is formed by chemical vapor deposition or atomic layer deposition and is composed of a dielectric layer which may include, but is not limited to, silicon nitride, hafnium oxide, zirconium oxide, hafnium silicate, hafnium oxy-nitride, hafnium zirconium oxide and lanthanum oxide. In a specific embodiment, tunnel dielectric layer 404A has a thickness in the range of 1-10 nanometers. In a particular embodiment, tunnel dielectric layer 404A has a thickness of approximately 2 nanometers.

Multi-layer charge-trapping region 404B may be composed of any material and have any thickness suitable to store charge and, hence, raise the threshold voltage of gate stack 404. In one embodiment, multi-layer charge-trapping region 404B is formed by a chemical vapor deposition process and is composed of a dielectric material which may include, but is not limited to, stoichiometric silicon nitride, silicon-rich silicon nitride and silicon oxy-nitride. In accordance with an embodiment of the present invention, multi-layer charge-trapping region 404B includes a deuterated layer 406 between tunnel dielectric layer 404A and charge trapping layer 408, as depicted in FIG. 4. Deuterated layer 406 and charge-trapping layer 408 may be composed of a deuterated derivative and a non-deuterated derivative, respectively, of the same material. For example, in accordance with an embodiment of the present invention, deuterated layer 406 is a deuterated derivative of silicon oxy-nitride, while charge-trapping layer 408 is formed from the hydrogenated derivative of silicon oxy-nitride. In one embodiment, the total thickness of multi-layer charge-trapping region 404B is in the range of 5-10 nanometers. In a specific embodiment, the ratio of thicknesses of deuterated layer 406:charge-trapping layer 408 is approximately 1:1, respectively.

Multi-layer charge-trapping region 404B may have an abrupt interface between deuterated layer 406 and charge-trapping layer 408. That is, in accordance with an embodiment of the present invention, charge-trapping layer 408 is deuterium-free. Alternatively, a gradient of deuterium atom concentration moving from high concentration of deuterium in deuterated layer 406 ranging to low concentration of deuterium in charge-trapping layer 408 may be formed. Thus, in accordance with an alternative embodiment of the present invention, charge-trapping layer 408 is a partially deuterated layer, but having a deuterium concentration less than that of deuterated layer 406.

Top dielectric layer 404C may be any material and have any thickness suitable to maintain a barrier to charge leakage without significantly decreasing the capacitance of gate stack 404. In one embodiment, top dielectric layer 404C is formed by a chemical vapor deposition process and is composed of silicon dioxide, silicon oxynitride, silicon nitride, or a combination thereof. In another embodiment, top dielectric layer 404C is formed by atomic layer deposition and is composed of a high-k dielectric layer which may include, but is not limited to, hafnium oxide, zirconium oxide, hafnium silicate, hafnium oxy-nitride, hafnium zirconium oxide and lanthanum oxide. In a specific embodiment, top dielectric layer 404C has a thickness in the range of 1-20 nanometers.

Gate layer 404D may be composed of any conductor or semiconductor material suitable for accommodating a bias during operation of a SONOS-type transistor. In accordance with an embodiment of the present invention, gate layer 404D is formed by a chemical vapor deposition process and is composed of doped poly-crystalline silicon. In another embodiment, gate layer 404D is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel.

Figure 5:
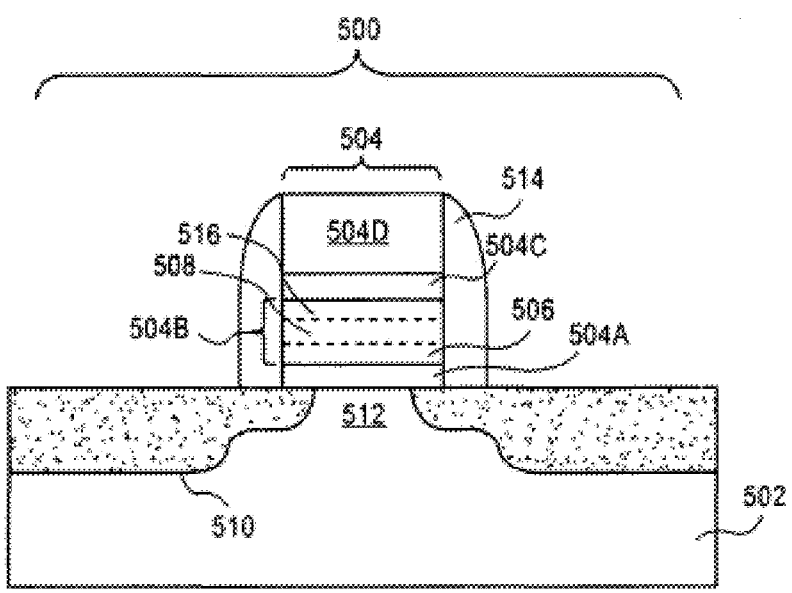
FIG. 5 illustrates a cross-sectional view of a nonvolatile charge trap memory device, in accordance with an embodiment of the present invention.

A nonvolatile charge trap memory device may include a multi-layer charge-trapping region having more than one deuterated layer. FIG. 5 illustrates a cross-sectional view of a nonvolatile charge trap memory device, in accordance with an embodiment of the present invention.

Referring to FIG. 5, semiconductor device 500 includes a gate stack 504 formed over a substrate 502. Semiconductor device 500 further includes source and drain regions 510 in substrate 502 on either side of gate stack 504, defining a channel region 512 in substrate 502 underneath gate stack 504. Gate stack 504 includes a tunnel dielectric layer 504A, a multi-layer charge-trapping region 504B, a top dielectric layer 504C and a gate layer 504D. Thus, gate layer 504D is electrically isolated from substrate 502. Multi-layer charge-trapping region 504B includes a first deuterated layer 506 and a second deuterated layer 516 sandwiching charge-trapping layer 508 of multi-layer charge trapping region 504 B. A pair of dielectric spacers 514 isolates the sidewalls of gate stack 504.

Semiconductor device 500 may be any semiconductor device described in association with semiconductor device 400 from FIG. 4. Substrate 502, source and drain regions 510 and channel region 512 may be composed of any material and dopant impurity atoms described in association with substrate 402, source and drain regions 410 and channel region 412, respectively, from FIG. 4. Tunnel dielectric layer 504A, top dielectric layer 504C and gate layer 504D may be composed of any material described in association with tunnel dielectric layer 404A, top dielectric layer 404C and gate layer 404D, respectively, from FIG. 4.

However, in contrast to semiconductor device 400, semiconductor device includes a multi-layer charge-trapping region 504B having second deuterated layer 516 above charge trapping layer 508, as depicted in FIG. 5. First deuterated layer 506 and charge-trapping layer 508 may be composed of any material described in association with deuterated layer 406 and charge-trapping layer 408, respectively, from FIG. 4. Additionally, second deuterated layer 516 may also be composed of any material described in association with deuterated layer 406 from FIG. 4. However, in accordance with an embodiment of the present invention, the total thickness of multilayer charge-trapping region 504B is in the range of 5-10 nanometers, i.e. multi-layer charge-trapping region 504B has a thickness in the same range as multi-layer charge trapping region 404B from FIG. 4. Thus, the relative ratios of thicknesses of deuterated layers and the charge-trapping layer may differ from those of semiconductor device 400. For example, in one embodiment, the ratio of thicknesses of first deuterated layer 506:charge-trapping layer 508:second deuterated layer 516 is approximately 1:2:1, respectively.

As with multi-layer charge-trapping region 404B from FIG. 4, multilayer charge-trapping region 504B may have an abrupt interface between first deuterated layer 506 and charge-trapping layer 508. Likewise, as second abrupt interface may exist between second deuterated layer 516 and charge-trapping layer 508. That is, in accordance with an embodiment of the present invention, charge-trapping layer 508 is deuterium-free. Alternatively, a gradient of deuterium atom concentration moving from high concentration of deuterium in first and second deuterated layers 506 and 516 ranging to low concentration of deuterium in charge-trapping layer 508 may be formed. Thus, in accordance with an alternative embodiment of the present invention, charge-trapping layer 508 is a partially deuterated layer, but having a deuterium concentration less than that of deuterated layers 506 and 516.

A nonvolatile charge trap memory device may be fabricated to include a multi-layer charge-trapping region having a deuterated layer. FIGS. 6A-I illustrate cross-sectional views representing steps in the formation of a nonvolatile charge trap memory device, in accordance with an embodiment of the present invention.

Figure 6A:
FIG. 6A illustrates a cross-sectional view representing a step in the formation of a nonvolatile charge trap memory device, in accordance with an embodiment of the present invention.

Referring to FIG. 6A, a substrate 602 is provided. Substrate 602 may be composed of any material and have any characteristics described in association with substrates 402 and 502 from FIGS. 4 and 5, respectively.

Figure 6B:
FIG. 6B illustrates a cross-sectional view representing a step in the formation of a nonvolatile charge trap memory device, in accordance with an embodiment of the present invention.

Referring to FIG. 6B, a tunnel dielectric layer 620 is formed on the top surface of substrate 602. Tunnel dielectric layer 620 may be formed from any material, from any process, and have any thickness described in association with tunnel dielectric layers 404A and 504A from FIGS. 4 and 5, respectively.

Figure 6C:
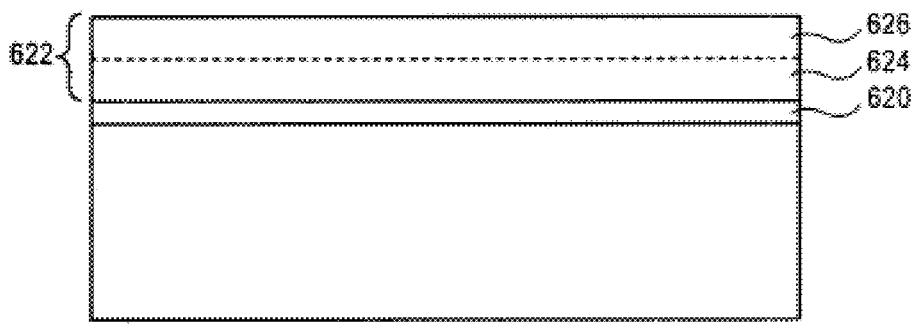
FIG. 6C illustrates a cross-sectional view representing a step in the formation of a nonvolatile charge trap memory device, in accordance with an embodiment of the present invention.

Referring to FIG. 6C, a multi-layer charge-trapping region 622 is formed on the top surface of tunnel dielectric layer 620. In accordance with an embodiment of the present invention, multi-layer charge-trapping region 622 includes a deuterated layer 624 between tunnel dielectric layer 620 and a charge-trapping layer 626, as depicted in FIG. 6C. Deuterated layer 624 and charge-trapping layer 626 may be composed of any materials and have any thicknesses described in association with deuterated layer 406 and charge-trapping layer 408, respectively, from FIG. 4. Multi-layer charge-trapping region 622 and, hence, deuterated layer 624 and charge-trapping layer 626 may be formed by any process suitable to provide substantially uniform coverage above tunnel dielectric layer 620. In accordance with an embodiment of the present invention, multi-layer charge-trapping region 622 is formed by a chemical vapor deposition process. In one embodiment, deuterated layer 624 is formed first using deuterated formation gases and, subsequently, charge-trapping layer 626 is formed next using non-deuterated formation gases. In a specific embodiment, multi-layer charge-trapping region 622 is composed substantially of silicon oxy-nitride, wherein deuterated layer 624 is first formed using formation gases such as, but not limited to, deuterated silane ($SiD_4$), deuterated dichlorosilane ($SiD_2Ch$), nitrous oxide ($N_2O$), deuterated ammonia ($ND_3$) and oxygen ($O_2$). Charge-trapping layer 626 is then formed using formation gases such as, but not limited to, non-deuterated-bis (tert-butylamino) silane (non-deuterated-BTBAS), silane embodiment, deuterated layer 624 and charge-trapping layer 626 are formed in the same process step, i.e., they are formed in the same process chamber with a seamless transition from deuterated formation gases to non-deuterated formation gases.

An abrupt deuterated and non-deuterated junction may be present at the interface of deuterated layer 624 and charge-trapping layer 626. Thus, in accordance with an embodiment of the present invention, charge-trapping layer 626 remains deuterium free. Alternatively, some of the deuterium present in deuterated layer 624 may migrate to charge-trapping layer 626 during the deposition of charge-trapping layer 626 or during subsequent high temperature process steps. That is, a gradient of deuterium atom concentration moving from high concentration of deuterium in deuterated layer 624 ranging to low concentration of deuterium in charge-trapping layer 626 may be formed. Thus, in accordance with an alternative embodiment of the present invention, charge trapping layer 626 becomes a partially deuterated layer, but having a deuterium concentration less than that of deuterated layer 624. In a specific embodiment, deuterated formation gases are employed to form a partially deuterated charge-trapping layer 626 having a deuterium concentration less than that of deuterated layer 624.

Figure 6D:
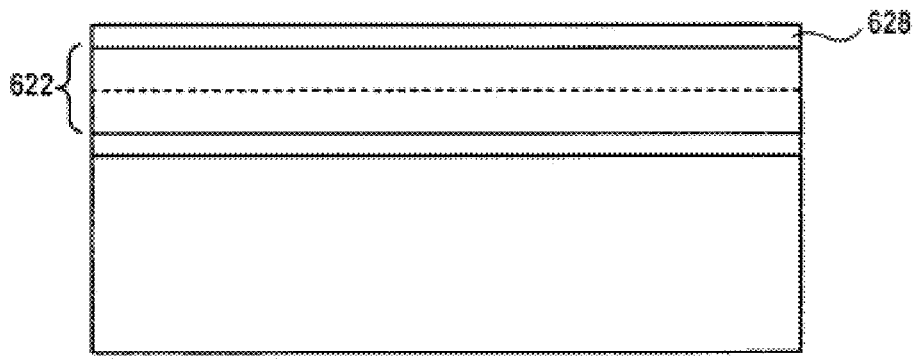
FIG. 6D illustrates a cross-sectional view representing a step in the formation of a nonvolatile charge trap memory device, in accordance with an embodiment of the present invention.

Referring to FIG. 6D, a top dielectric layer 628 is formed on the top surface of multi-layer charge-trapping region 622. Top dielectric layer 628 may be formed from any material, from any process, and have any thickness described in association with top dielectric layers 404C and 504C from FIGS. 4 and 5, respectively. In accordance with an alternative embodiment of the present invention, top dielectric layer 628 is formed by using deuterated formation gases. In such an embodiment, deuterated top dielectric layer 628 subsequently acts as a source of deuterium to form a trap-free layer in multi-layer charge-trapping region 622 during a subsequent anneal process. In a specific alternative embodiment, deuterated top dielectric layer 628 is formed using formation gases such as, but not limited to, $SiD_4$, $SiD_2Cl_2$ and $N_2O$.

Figure 6E:
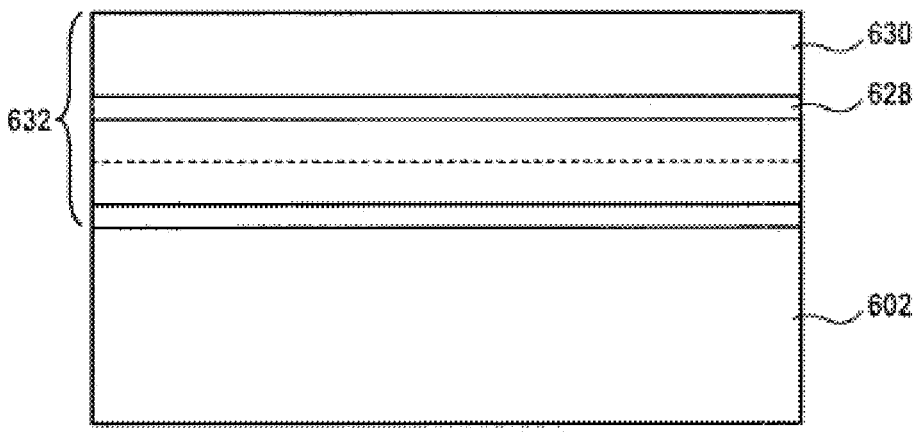
FIG. 6E illustrates a cross-sectional view representing a step in the formation of a nonvolatile charge trap memory device, in accordance with an embodiment of the present invention.

Referring to FIG. 6E, a gate layer 630 is formed on the top surface of top dielectric layer 628. Gate layer 630 may be formed from any material and from any process described in association with gate layers 404D and 504D from FIGS. 4 and 5, respectively. Thus, a gate stack 632 may be formed above substrate 602.

Figure 6F:
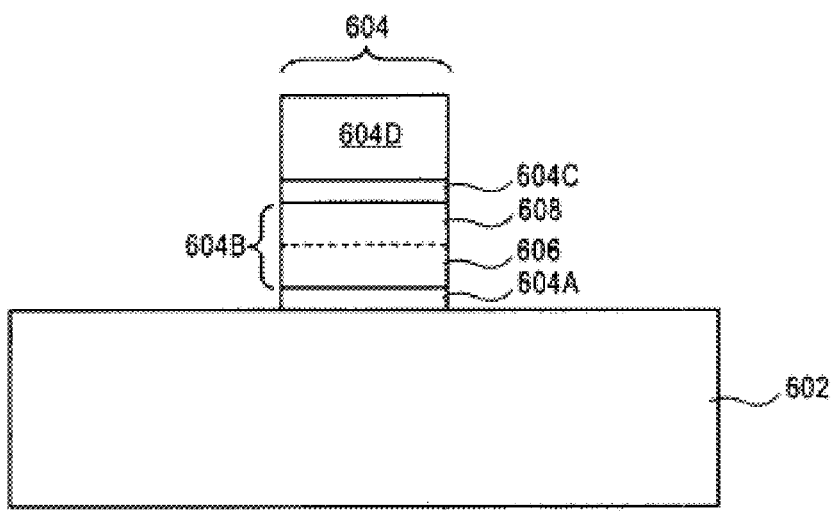
FIG. 6F illustrates a cross-sectional view representing a step in the formation of a nonvolatile charge trap memory device, in accordance with an embodiment of the present invention.

Referring to FIG. 6F, gate stack 632 is patterned to form a patterned gate stack 604 above substrate 602. Patterned gate stack 604 includes a patterned tunnel dielectric layer 604A, a patterned multi-layer charge-trapping region 604B, a patterned top dielectric layer 604C, and a patterned gate layer 604D. Patterned multi-layer charge trapping region 604B includes a patterned deuterated layer 606 and a patterned charge trapping layer 608. Gate stack 632 may be patterned to form patterned gate stack 604 by any process suitable to provide substantially vertical sidewalls for gate stack 604 with high selectivity to substrate 602. In accordance with an embodiment of the present invention, gate stack 632 is patterned to form patterned gate stack 604 by a lithography and etch process. In a specific embodiment, the etch process is an anisotropic etch process utilizing gases such as, but not limited to, carbon tetrafluoride ($CF_4$), $O_2$, hydrogen bromide (HBr) and chlorine ($Cl_2$).

Figure 6G:
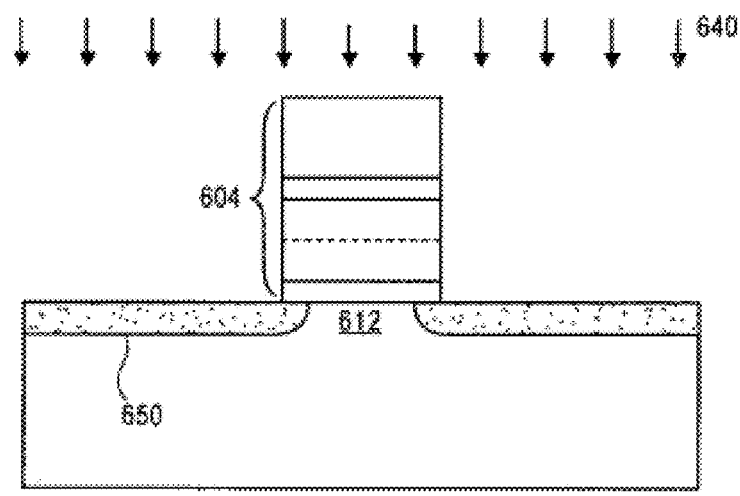
FIG. 6G illustrates a cross-sectional view representing a step in the formation of a nonvolatile charge trap memory device, in accordance with an embodiment of the present invention.

Referring to FIG. 6G, it may be desirable to implant dopant impurity atoms 640 into the exposed portions of substrate 604 to form source and drain tip extension regions 650. Source and drain tip extension regions 650 will ultimately become part of source and drain regions subsequently formed, as described below. Thus, by forming source and drain tip extension regions 650 as defined by the location of patterned gate stack 604, channel region 612 may be defined, as depicted in FIG. 6G. In one embodiment, the conductivity type and the concentration of dopant impurity atoms used to form source and drain tip extension regions 650 are substantially the same as those used to form source and drain regions, described below.

Figure 6H:
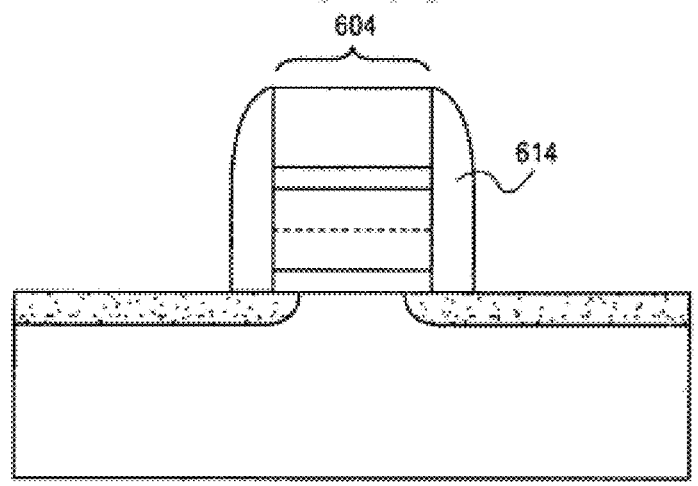
FIG. 6H illustrates a cross-sectional view representing a step in the formation of a nonvolatile charge trap memory device, in accordance with an embodiment of the present invention.
Figure 6I:
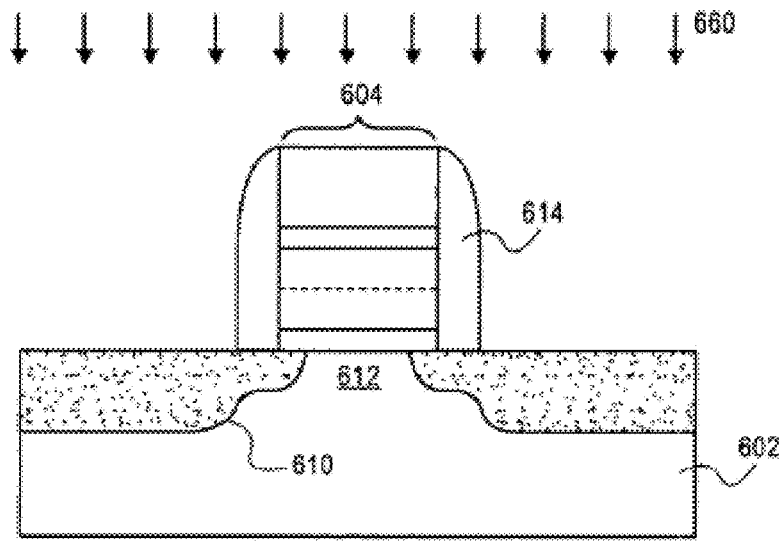
FIG. 6I illustrates a cross-sectional view representing a step in the formation of a nonvolatile charge trap memory device, in accordance with an embodiment of the present invention.

Referring to FIG. 6H, it may be desirable to form a pair of dielectric spacers 614 on the sidewalls of patterned gate stack 604. Finally, referring to FIG. 6I, source and drain regions 610 are formed by implanting dopant impurity atoms 660 into the exposed portions of substrate 604. Source and drain regions 610 may have any characteristics as those described in association with source and drain regions 410 and 510 from FIGS. 4 and 5, respectively. In accordance with an embodiment of the present invention, the profile of source and drain regions 610 is defined by dielectric spacers 614, patterned gate stack 604 and source and drain tip extension regions 650, as depicted in FIG. 6I.

Figure 7A:
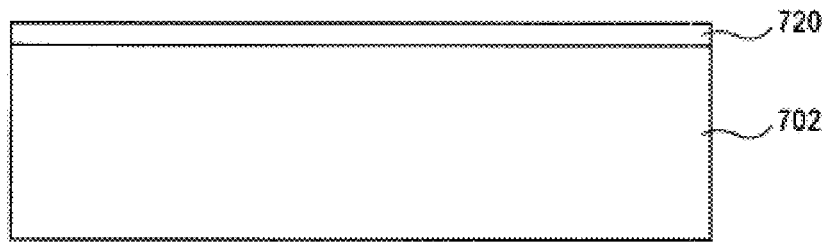
FIG. 7A illustrates a cross-sectional view representing a step in the formation of a nonvolatile charge trap memory device, in accordance with an embodiment of the present invention.
Figure 7B:
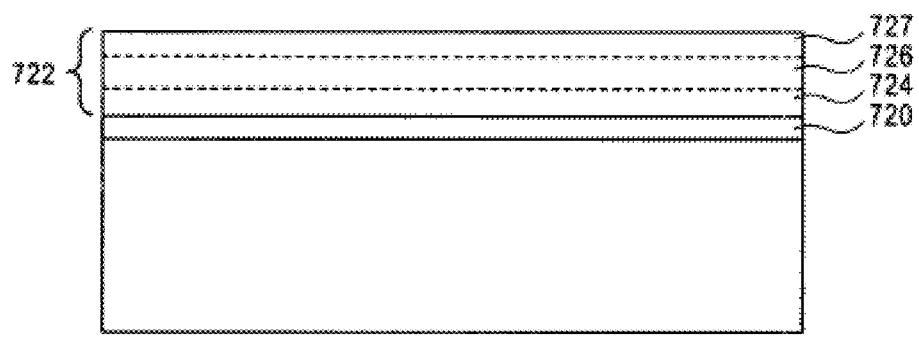
FIG. 7B illustrates a cross-sectional view representing a step in the formation of a nonvolatile charge trap memory device, in accordance with an embodiment of the present invention.
Figure 7C:
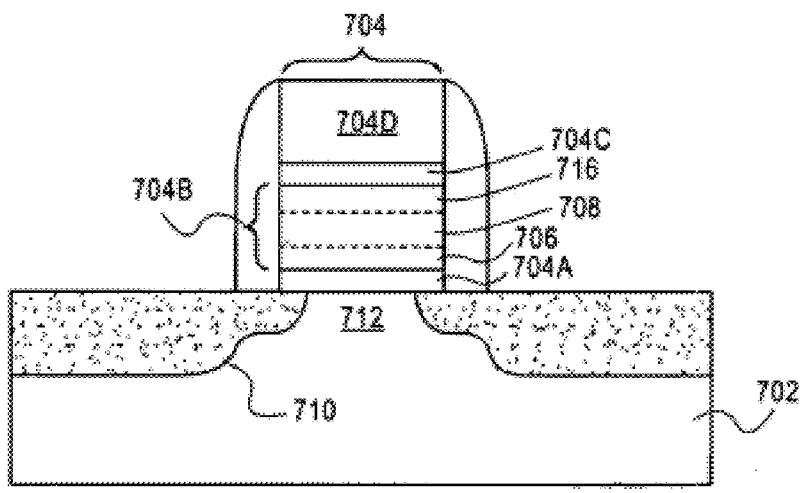
FIG. 7C illustrates a cross-sectional view representing a step in the formation of a nonvolatile charge trap memory device, in accordance with an embodiment of the present invention.

A nonvolatile charge trap memory device may be fabricated to include a multi-layer charge-trapping region having more than one deuterated layer. FIGS. 7A-C illustrate cross-sectional views representing steps in the formation of a nonvolatile charge trap memory device, in accordance with an embodiment of the present invention.

Referring to FIG. 7A, a tunnel dielectric layer 720 formed on the top surface of a substrate 702 is provided. Substrate 702 may be composed of any material and have any characteristics described in association with substrates 402 and 502 from FIGS. 4 and 5, respectively. Tunnel dielectric layer 720 may be formed from any material, from any process, and have any thickness described in association with tunnel dielectric layers 404A and 504A from FIGS. 4 and 5, respectively.

Referring to FIG. 7B, a multi-layer charge-trapping region 722 is formed on the top surface of tunnel dielectric layer 720. In accordance with an embodiment of the present invention, multi-layer charge-trapping region 722 includes a first deuterated layer 724 between tunnel dielectric layer 720 and a charge-trapping layer 726. Additionally multi-layer charge-trapping region 722 includes a second deuterated layer 727 on the top surface of charge-trapping layer 726, as depicted in FIG. 7B. First deuterated layer 724, charge-trapping layer 726, and second deuterated layer 727 may be composed of any materials and have any thicknesses described in association with first deuterated layer 506, charge-trapping layer 508, and second deuterated layer 516, respectively, from FIG. 5. Multi-layer charge-trapping region 722 and, hence, first and second deuterated layers 724 and 727 and charge-trapping layer 726 may be formed by any process suitable to provide substantially uniform coverage above tunnel dielectric layer 720. In accordance with an embodiment of the present invention, multi-layer charge-trapping region 722 is formed by a chemical vapor deposition process. In one embodiment, first deuterated layer 724 is formed first using deuterated formation gases, charge-trapping layer 726 is formed next using non-deuterated formation gases and, finally, second deuterated layer 727 is formed using deuterated formation gases. In a specific embodiment, multi-layer charge-trapping region 722 is composed substantially of silicon oxy-nitride, wherein first deuterated layer 724 is formed first using formation gases such as, but not limited to, $SiD_4$, $SiD_2Cl_2$, $N_2O$, $ND_3$ and $O_2$. Charge-trapping layer 626 is then formed using formation gases such as, but not limited to, non-deuterated-BTBAS, $SiH_4$, $SiH_2Cl_2$, $N_2O$, $NH_3$ and $O_2$. Finally, second deuterated layer 727 is formed using formation gases such as, but not limited to, $SiD_4$, $SiD_2Cl_2$, $N_2O$, $ND_3$ and $O_2$. In a particular embodiment, first deuterated layer 724, charge-trapping layer 726 and second deuterated layer 727 are formed in the same process step, i.e. in the same process chamber with a seamless transition from deuterated formation gases to non-deuterated formation gases and back to deuterated formation gases.

An abrupt deuterated and non-deuterated junction may be present at the interfaces of first deuterated layer 724, second deuterated layer 727 and charge-trapping layer 726. Thus, in accordance with an embodiment of the present invention, charge trapping layer 726 remains deuterium-free. Alternatively, some of the deuterium present in first and second deuterated layers 724 and 727 may migrate to charge-trapping layer 726 during the deposition of charge-trapping layer 726 and second deuterated layer 727 or during subsequent high temperature process steps. That is, a gradient of deuterium atom concentration moving from high concentration of deuterium in first and second deuterated layers 724 and 727 ranging to low concentration of deuterium in charge-trapping layer 726 may be formed. Thus, in accordance with an alternative embodiment of the present invention, charge-trapping layer 726 becomes a partially deuterated layer, but having a deuterium concentration less than that of first and second deuterated layers 724. In a specific embodiment, deuterated formation gases are employed to form a partially deuterated charge-trapping layer 726 having a deuterium concentration less than that of deuterated layer 724.

Referring to FIG. 7C, process steps similar to those described in association with FIGS. 6D-I are carried out to form a nonvolatile charge trap memory device having more than one deuterated layer. Thus, a patterned gate stack 704 is formed over a substrate 702. Source and drain regions 710 are formed on either side of patterned gate stack 704, defining a channel region 712. Patterned gate stack 704 includes a patterned tunnel dielectric layer 704A, a patterned multi-layer charge-trapping region 704B, a patterned top dielectric layer 704C and a patterned gate layer 704D. Patterned multi-layer charge-trapping region 704B includes a patterned first deuterated layer 706 and a patterned second deuterated layer 716 sandwiching patterned charge-trapping layer 708.

Implementations and Alternatives

Figure 8A:
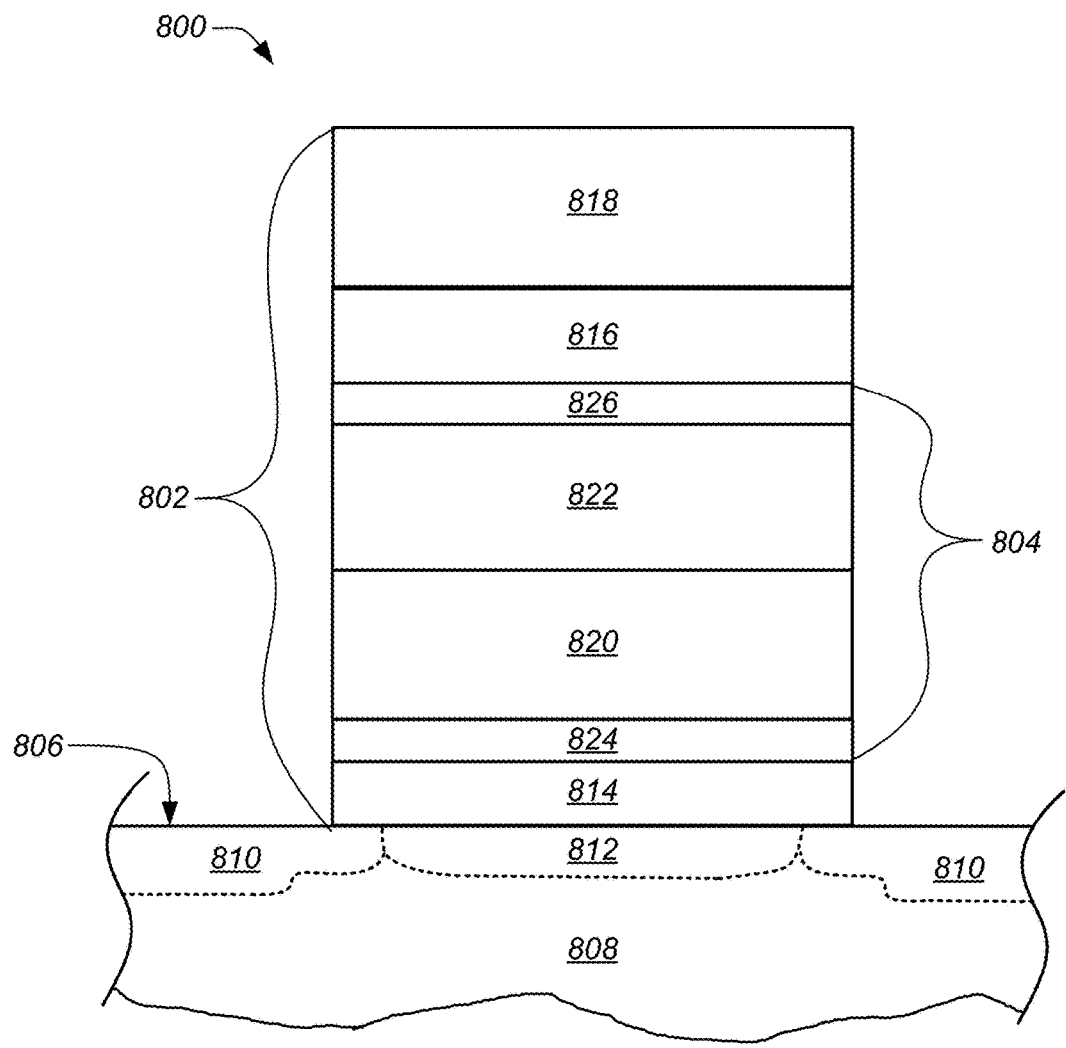
FIG. 8A illustrates a cross-sectional view of a nonvolatile charge trap memory device including an ONNO stack.

In one aspect the present disclosure is directed to charge trap memory devices including one or more deuterated layers and a split multi-layer charge-trapping region with two or more nitride containing layers. FIG. 8A is a block diagram illustrating a cross-sectional side view of one such embodiment.

Referring to FIG. 8A, the memory device 800 includes a gate stack 802 with a split multi-layer charge-trapping region 804 formed over a surface 806 of a silicon substrate 808 or over a surface of a silicon layer formed on a substrate. Generally, the device 800 further includes one or more diffusion regions 810, such as source and drain regions or structures, aligned to the gate stack 802 and separated by a channel region 812.

In addition to the multi-layer charge-trapping region 804, the gate stack 802 further includes a thin, tunnel dielectric layer 814 that separates or electrically isolates the gate stack from the channel region 812, a top or blocking dielectric layer 816, and a gate layer 818.

The multi-layer charge-trapping region 804 generally includes at least two layers having differing compositions of silicon, oxygen and nitrogen. In one embodiment, the multi-layer charge-trapping region includes a first nitride layer 820 comprising a substantially trap-free, silicon-rich, oxygen-rich nitride, and a second nitride layer 822 comprising a trap-dense, silicon-rich, nitrogen-rich, and oxygen-lean nitride. It has been found that a silicon-rich, oxygen-rich, first nitride layer 820 decreases the charge loss rate after programming and after erase, which is manifested in a small voltage shift in the retention mode. A silicon-rich, nitrogen-rich, and oxygen-lean second nitride layer 816 improves the speed and increases of the initial difference between program and erase voltage without compromising a charge loss rate of memory devices made using an embodiment of the silicon-oxide-oxynitride-oxide-silicon structure, thereby extending the operating life of the device.

In addition to the first and second nitride layers 820, 822, the multi-layer charge-trapping region 804 further includes one or more deuterated layers. In the embodiment shown the multi-layer charge-trapping region 804 includes a first deuterated layer 824 separating the first nitride layer 820 from the tunnel dielectric layer 814, and a second deuterated layer 826 separating the second nitride layer 822 from the blocking dielectric layer 818. The first and second deuterated layers 824, 826, can be composed of a deuterated derivative of the same material used to form the first and second nitride layers 820, 822. For example, in an embodiment in which the first and second nitride layers 820, 822 include silicon nitride and/or silicon oxynitride the first and second deuterated layers 824, 826, can be composed of a deuterated derivative of silicon oxynitride.

In one embodiment, the total thickness of multi-layer charge-trapping region 804 is in the range of 5-10 nanometers, the thicknesses of the individual deuterated layers and nitride layers is approximately equal.

Multi-layer charge-trapping region 804 may have an abrupt interface between the first deuterated layer 824 and the first nitride layer 820. That is, in accordance with one embodiment, the first nitride layer 820. Alternatively, a gradient of deuterium atom concentration moving from high concentration of deuterium in the first deuterated layer 824 ranging to low concentration of deuterium in the first nitride layer 820 may be formed. Thus, in accordance with an alternative embodiment, the first nitride layer 820 is a partially deuterated layer, but having a deuterium concentration less than that of the first deuterated layer 824.

Substrate 808 and, hence, channel region 812, may be composed of any material suitable for semiconductor device fabrication. In one embodiment, substrate 802 is a bulk substrate composed of a material which may include, but is not limited to, silicon, germanium, silicon-germanium or a III-V compound semiconductor material. In another embodiment, substrate 808 includes a bulk layer with a top epitaxial layer composed of a material which may include, but is not limited to, silicon, germanium, silicon-germanium, a III-V compound semiconductor material and quartz in and on which the memory device 800 is fabricated. Substrate 808 and, hence, channel region 812, may include dopant impurity atoms. In a specific embodiment, the channel region 812 includes polycrystalline silicon or polysilicon and is doped P-type, or, in an alternative embodiment, doped N-type. In another specific embodiment, the channel region 812 includes recrystallized polysilicon and is doped either P-type or N-type.

Source and drain regions 810 in substrate 808 may be any regions having opposite conductivity to channel region 812. For example, in one embodiment, the source and drain regions 810 are N-type doped regions while channel region 812 is a P-type doped region. In one version of this embodiment, the substrate 808 and, hence, channel region 812, is composed of boron-doped silicon having a boron concentration in the range of $1 \times 10^{15}$-$1 \times 10^{19}$ atoms/cm$^3$. Source and drain regions 810 are composed of phosphorous- or arsenic-doped regions having a concentration of N-type dopants in the range of $5 \times 10^{16}$-$5 \times 10^{19}$ atoms/cm$^3$. In a specific embodiment, source and drain regions 810 have a depth in substrate 808 in the range of 80-200 nanometers. In an alternative embodiment, source and drain regions 810 are P-type doped regions while channel region 812 is an N-type doped region.

The tunnel dielectric layer 814 may be any material and have any thickness suitable to allow charge carriers to tunnel into the multi-layer charge-trapping region 804 under an applied gate bias while maintaining a suitable barrier to leakage when the memory device 800 is unbiased. In one embodiment, tunnel dielectric layer 814 is formed by a thermal oxidation process and is composed of silicon dioxide or silicon oxy-nitride, or a combination thereof. In another embodiment, tunnel dielectric layer 814 is formed by chemical vapor deposition or atomic layer deposition and is composed of a dielectric layer which may include, but is not limited to, silicon nitride, hafnium oxide, zirconium oxide, hafnium silicate, hafnium oxy-nitride, hafnium zirconium oxide and lanthanum oxide. In a specific embodiment, tunnel dielectric layer 814 has a thickness in the range of 1-10 nanometers. In a particular embodiment, tunnel dielectric layer 814 has a thickness of approximately 2 nanometers.

The blocking dielectric layer 816 may be any material and have any thickness suitable to maintain a barrier to charge leakage without significantly decreasing the capacitance of gate stack 802. In one embodiment, the blocking dielectric layer 816 is formed by a chemical vapor deposition process and is composed of silicon dioxide, silicon oxynitride, silicon nitride, or a combination thereof. In another embodiment, the blocking dielectric layer 816 is formed by atomic layer deposition and is composed of a high-k dielectric layer which may include, but is not limited to, hafnium oxide, zirconium oxide, hafnium silicate, hafnium oxy-nitride, hafnium zirconium oxide and lanthanum oxide. In a specific embodiment, the blocking dielectric layer 816 has a thickness in the range of 1-20 nanometers.

Gate layer 818 may be composed of any conductor or semiconductor material suitable for accommodating a bias during operation of a SONOS-type transistor, including doped polysilicon and a metal-containing material. In a specific embodiment, the gate layer 818 has a thickness in the range of 1-20 nanometers.

Figure 8B:
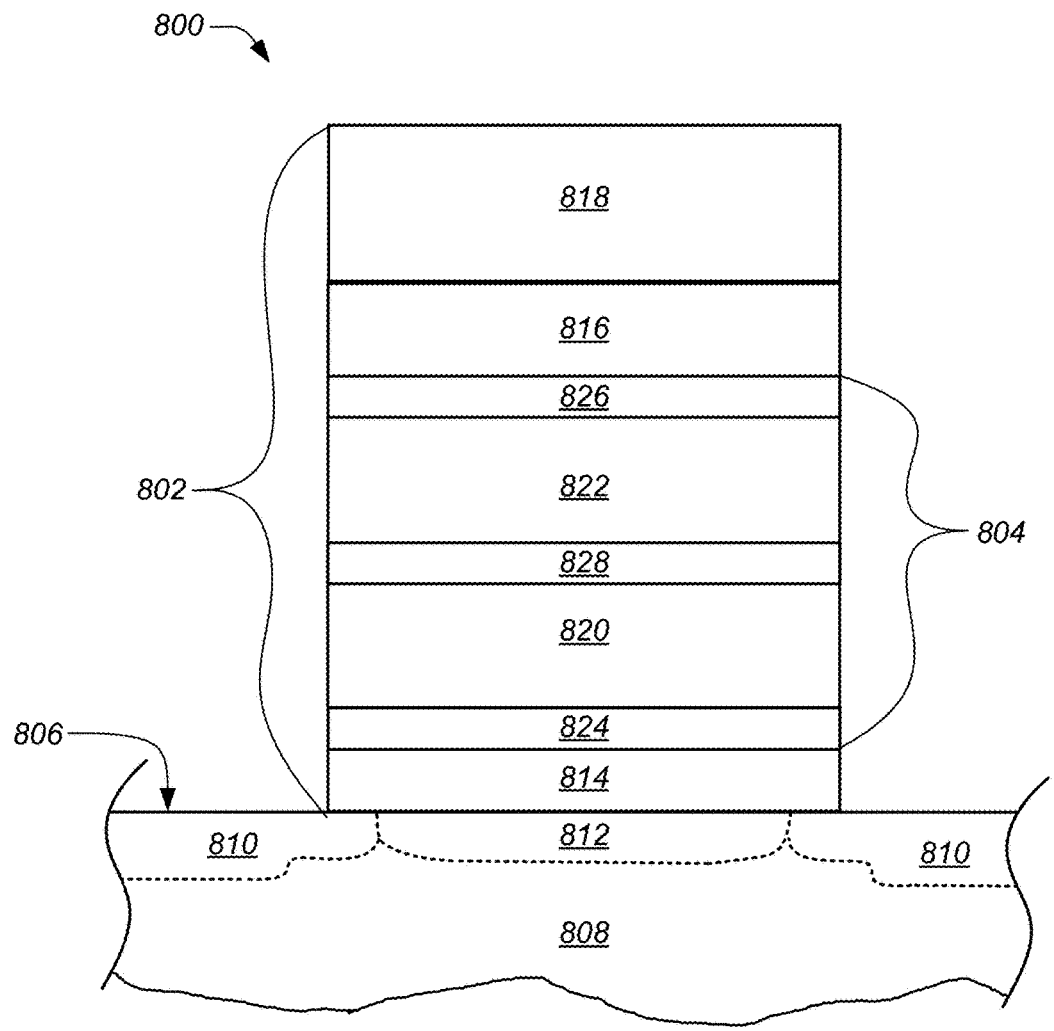
FIG. 8B illustrates a cross-sectional view of a nonvolatile charge trap memory device including an ONONO stack.

In another embodiment shown in FIG. 8B the multi-layer charge-trapping region 804 further includes an intermediate oxide or anti-tunneling layer 828 comprising an oxide separating the first nitride layer 820 from the second nitride layer 822. During an erase of the memory device 800 holes migrate toward the blocking dielectric layer 816, but the majority of trapped hole charges form in the second nitride layer 822. Electron charge accumulates at the boundaries of the second nitride layer 822 after programming, and thus there is less accumulation of charge at the lower boundary of the first nitride layer 820. Furthermore, due to the anti-tunneling layer 828, the probability of tunneling by trapped electron charges in the second layer 822 is substantially reduced. This may result in lower leakage current than for the conventional memory devices.

Although shown and described above as having two nitride layers, i.e., a first and a second layer, the present invention is not so limited, and the multi-layer charge-trapping region may include a number, n, of nitride layers, any or all of which may have differing stoichiometric compositions of oxygen, nitrogen and/or silicon. In particular, multi-layer charge storing structures having up to five, and possibly more, nitride layers each with differing stoichiometric compositions are contemplated. At least some of these layers will be separated from the others by one or more relatively thin oxide layers. However, as will be appreciated by those skilled in the art it is generally desirable to utilize as few layers as possible to accomplish a desired result, reducing the process steps necessary to produce the device, and thereby providing a simpler and more robust manufacturing process. Moreover, utilizing as few layers as possible also results in higher yields as it is simpler to control the stoichiometric composition and dimensions of the fewer layers.

A method or forming or fabricating a memory device including a split multi-layer charge-trapping region according to one embodiment will now be described with reference to the flowchart of FIG. 9.

Figure 9:
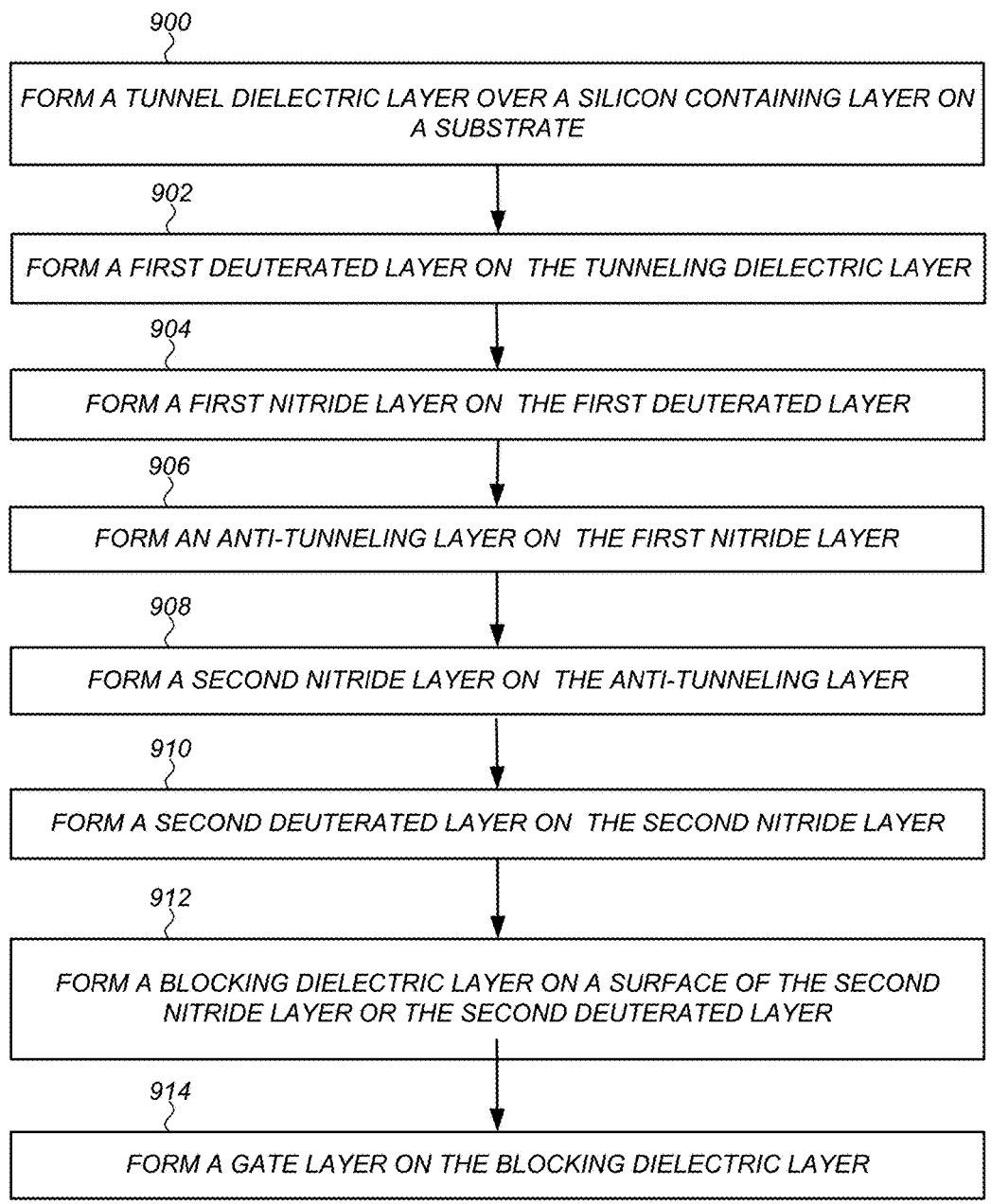
FIG. 9 depicts a Flowchart representing a series of operations in a method for fabricating a nonvolatile charge trap memory device including a split multi-layer charge-trapping region.

Referring to FIG. 9, the method begins with forming a tunnel dielectric layer over a silicon containing layer on a surface of a substrate (900). As noted above, in one embodiment the tunnel dielectric layer comprises silicon dioxide ($SiO_2$) and is formed or deposited a plasma oxidation process, In-Situ Steam Generation (ISSG) or a radical oxidation process in which hydrogen ($H_2$) and oxygen ($O_2$) gas are introduced into a process chamber to form radicals at a surface of the substrate to consume a portion of the substrate form the tunnel dielectric layer without an ignition event to pyrolyze the $H_2$ and $O_2$.

The first deuterated layer is then formed on a surface of the tunneling dielectric layer (902). The first deuterated layer can be formed or deposited in a low pressure CVD process using a process gas comprising a silicon source, such as silane ($SiH_4$), chlorosilane ($SiH_3Cl$), dichlorosilane or DCS ($SiH_2Cl_2$), tetrachlorosilane ($SiCl_4$) or Bis-TertiaryButylAmino Silane (BTBAS), an oxygen source, such as oxygen ($O_2$) or $N_2O$, and a nitrogen source containing deuterium, such as deuterated-ammonia ($ND_3$).

Next, the first nitride or nitride containing layer of the multi-layer charge-trapping region is formed on a surface of the first deuterated layer (904). In one embodiment, the first nitride layer is formed or deposited in a low pressure CVD process using a silicon source, such as silane ($SiH_4$), chlorosilane (SiH3Cl), dichlorosilane or DCS ($SiH_2Cl_2$), tetrachlorosilane ($SiCl_4$) or Bis-TertiaryButylAmino Silane (BTBAS), a nitrogen source, such as nitrogen ($N_2$), ammonia ($NH_3$), nitrogen trioxide ($NO_3$) or nitrous oxide ($N_2O$), and an oxygen-containing gas, such as oxygen ($O_2$) or $N_2O$. For example, the first nitride layer can be deposited over the first deuterated layer by placing the substrate in a deposition chamber and introducing a process gas including $N_2O$, $NH_3$ and DCS, while maintaining the chamber at a pressure of from about 5 milliTorr (mT) to about 500 mT, and maintaining the substrate at a temperature of from about 700 degrees Celsius to about 850 degrees Celsius and in certain embodiments at least about 760 degrees Celsius, for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm). It has been found that an oxynitride layer produced or deposited under these condition yields a silicon-rich, oxygen-rich, first nitride layer.

An anti-tunneling layer is then formed or deposited on a surface of the first nitride layer (906). As with the tunneling oxide layer, the anti-tunneling layer can be formed or deposited by any suitable means, including a plasma oxidation process, In-Situ Steam Generation (ISSG) or a radical oxidation process. In one embodiment, the radical oxidation process involves flowing hydrogen ($H_2$) and oxygen ($O_2$) gas into a batch-processing chamber or furnace to effect growth of the anti-tunneling layer by oxidation consumption of a portion of the first nitride layer.

The second nitride layer of the multi-layer charge-trapping region is then formed on a surface of the anti-tunneling layer (908). The second nitride layer can be deposited over the anti-tunneling layer in a CVD process using a process gas including $N_2O$, $NH_3$ and DCS, at a chamber pressure of from about 5 mT to about 500 mT, and at a substrate temperature of from about 700 degrees Celsius to about 850 degrees Celsius and in certain embodiments at least about 760 degrees Celsius, for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 20 sccm. It has been found that an oxynitride layer produced or deposited under these condition yields a silicon-rich, nitrogen-rich, and oxygen-lean second nitride layer.

In some embodiments, the second nitride layer can be deposited over the anti-tunneling layer in a CVD process using a process gas including BTBAS and ammonia ($NH_3$) mixed at a ratio of from about 7:1 to about 1:7 to further include a concentration of carbon selected to increase the number of traps therein. The selected concentration of carbon in the second oxynitride layer can include a carbon concentration of from about 5% to about 15%.

Optionally, where the multi-layer charge-trapping region includes a second deuterated layer the method of fabricating the memory device can further include forming the second deuterated layer on the second nitride layer (910). As with the first deuterated layer, the second deuterated layer can be formed or deposited in a low pressure CVD process using a process gas comprising a silicon source, such as silane ($SiH_4$), chlorosilane ($SiH_3Cl$), dichlorosilane or DCS ($SiH_2Cl_2$), tetrachlorosilane ($SiCl_4$) or Bis-TertiaryButylAmino Silane (BTBAS), an oxygen source, such as oxygen ($O_2$) or $N_2O$, and a nitrogen source containing deuterium, such as deuterated-ammonia ($ND_3$).

Next, a top or blocking dielectric layer is formed on a surface of the second nitride layer of the multi-layer charge-trapping region or the second deuterated layer (912). As noted above the blocking dielectric layer can include any suitable dielectric material including a high K dielectric, silicon dioxide, silicon oxynitride, silicon nitride, or a combination thereof. In one embodiment, the blocking dielectric layer includes a relatively thick layer of $SiO_2$ thermally grown or deposited using a CVD process. Generally, the process involves exposing the substrate to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C. Alternatively, as with the tunneling oxide layer the blocking dielectric layer can be formed or deposited by any suitable means, including a plasma oxidation process, In-Situ Steam Generation (ISSG) or a radical oxidation process.

Finally, a gate layer is formed on a surface of the blocking dielectric layer (914). In one embodiment, the gate layer is formed by a CVD process and is composed of doped polysilicon. In another embodiment, the gate layer is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel.

In another aspect the present disclosure is also directed to multigate or multigate-surface memory devices including charge-trapping regions overlying two or more sides of a channel region formed on or above a surface of a substrate, and methods of fabricating the same. Multigate devices include both planar and non-planar devices. A planar multigate device (not shown) generally includes a double-gate planar device in which a number of first layers are deposited to form a first gate below a subsequently formed channel region, and a number of second layers are deposited thereover to form a second gate. A non-planar multigate device generally includes a horizontal or vertical channel region formed on or above a surface of a substrate and surrounded on three or more sides by a gate.

Figure 10A:
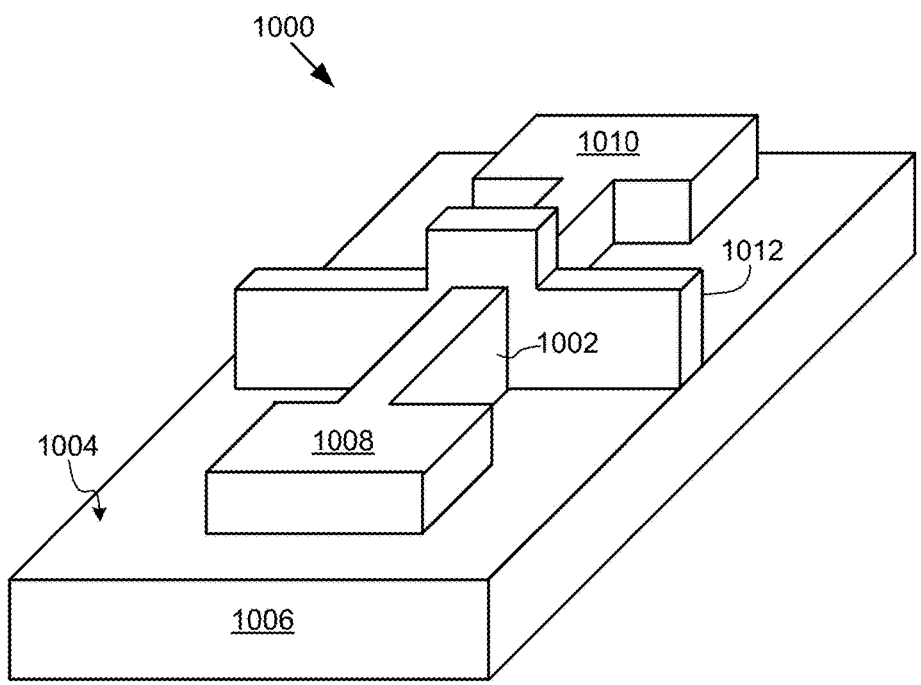
FIG. 10A illustrates a non-planar multigate device including a split charge-trapping region.

FIG. 10A illustrates one embodiment of a non-planar multigate memory device including a charge-trapping region. Referring to FIG. 10A, the memory device 1000, commonly referred to as a finFET, includes a channel region 1002 formed from a thin film or layer of semiconducting material overlying a surface 1004 on a substrate 1006 connecting a source 1008 and a drain 1010 of the memory device. The channel region 1002 is enclosed on three sides by a fin which forms a gate 1012 of the device. The thickness of the gate 1012 (measured in the direction from source to drain) determines the effective channel length of the device.

Figure 10B:
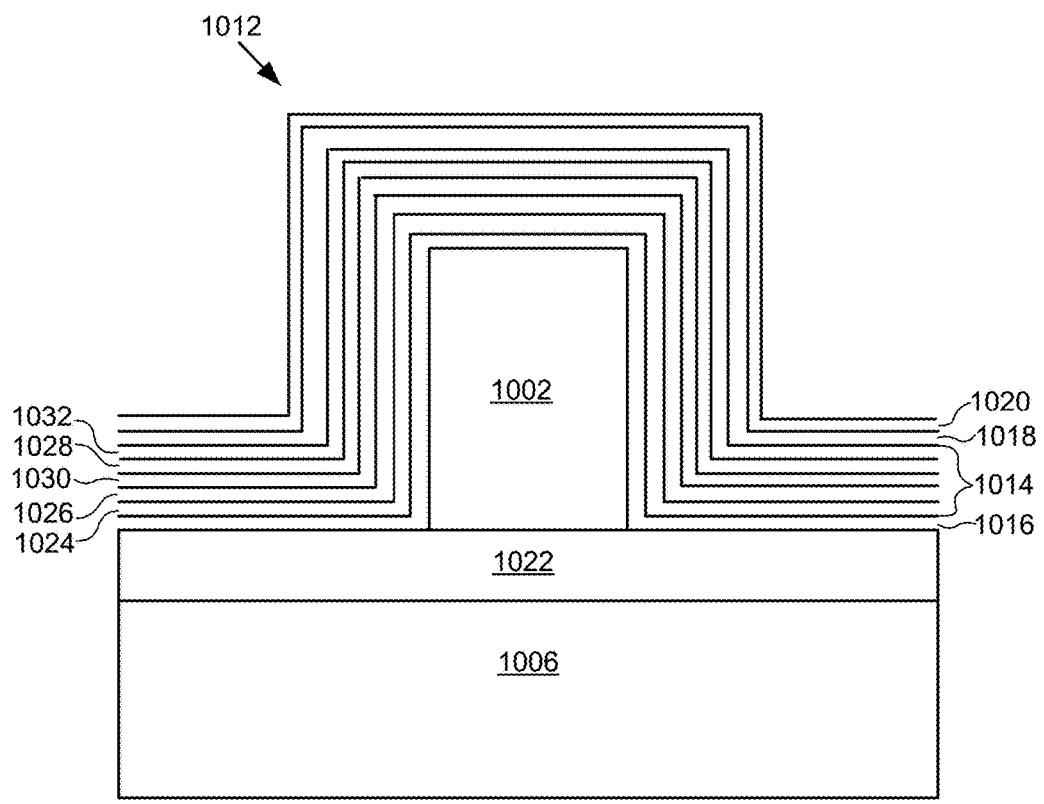
FIG. 10B illustrates a cross-sectional view of the non-planar multigate device of FIG. 10A.

In accordance with the present disclosure, the non-planar multigate memory device 1000 of FIG. 10A can include a split charge-trapping region with one or more deuterated layers. FIG. 10B is a cross-sectional view of a portion of the non-planar memory device of FIG. 10A including a portion of the substrate 1006, channel region 1002 and the gate stack 1012 illustrating a multi-layer charge-trapping region 1014. The gate 1012 further includes a tunnel dielectric layer 1016 overlying the raised channel region 1002, a blocking dielectric 1018 and a gate layer 1020 overlying the blocking dielectric layer to form a control gate of the memory device 1000. As with the embodiments described above In some embodiments the gate layer 1020 can include a metal or a doped polysilicon. The channel region 1002 and gate 1012 can be formed directly on substrate 1006 or on an insulating or dielectric layer 1022, such as a buried oxide layer, formed on or over the substrate.

Referring to FIG. 10B, in one embodiment the multi-layer charge-trapping region 1014 includes at least a first deuterated layer 1024 overlying the tunnel dielectric layer 1016, a first nitride layer 1026 overlying the first deuterated layer 1024, and a second nitride layer 1028 disposed on or above the first nitride layer. Generally, the second nitride layer 1028 includes a silicon-rich, oxygen-lean nitride layer and includes a majority of a charge traps distributed in multiple charge-trapping layers, while the first nitride layer 1026 includes an oxygen-rich nitride or silicon oxynitride, and is oxygen-rich relative to the top charge-trapping layer to reduce the number of charge traps therein. By oxygen-rich it is meant wherein a concentration of oxygen in the first nitride layer 1026 is from about 15 to about 40%, whereas a concentration of oxygen in top charge-trapping layer 1026 is less than about 5%.

In some embodiments, such as that shown, the multi-layer charge-trapping region 1014 further includes at least one thin, intermediate oxide or anti-tunneling layer 1030 separating the second nitride layer 1028 from the first nitride layer 1026. As noted above, the anti-tunneling layer 1030 substantially reduces the probability of electron charge that accumulates at the boundaries of the second nitride layer 1028 during programming from tunneling into the first nitride layer 1026.

As with the embodiments described above, either or both of the first nitride layer 1026 and the second nitride layer 1028 can include silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge-trapping region is then formed on the middle oxide layer. The second nitride layer 1028 has a stoichiometric composition of oxygen, nitrogen and/or silicon different from that of the first nitride layer 1026, and may also be formed or deposited by a CVD process using a process gas including $DCS/NH_3$ and $N_2O/NH_3$ gas mixtures in ratios and at flow rates tailored to provide a silicon-rich, oxygen-lean second nitride layer 1028.

In those embodiments including an anti-tunneling layer 1030 including oxide, the anti-tunneling layer can be formed by oxidation of the first nitride layer 1026, to a chosen depth using radical oxidation. Radical oxidation may be performed, for example, at a temperature of 1000-1100 degrees Celsius using a single wafer tool, or 800-900 degrees Celsius using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

In some embodiments, such as that shown, the multi-layer charge-trapping region 1014 further includes a second deuterated layer 1032 overlying the second nitride layer 1028 and separating the second nitride layer from the blocking dielectric layer 1018. As with embodiments described above, the second deuterated layer 1032 has a concentration of deuterium lower than a concentration of deuterium in the first deuterated layer 1024.

In another embodiment, shown in FIGS. 11A and 11B, the memory device can include a nanowire channel formed from a thin film of semiconducting material overlying a surface on a substrate connecting a source and a drain of the memory device. By nanowire channel it is meant a conducting channel region formed in a thin strip of crystalline silicon material, having a maximum cross-sectional dimension of about 10 nanometers (nm) or less, and more preferably less than about 6 nm. Optionally, the channel region can be formed to have <100> surface crystalline orientation relative to a long axis of the channel region.

Referring to FIG. 11A, the memory device 1100 includes a horizontal nanowire channel region 1102 formed from a thin film or layer of semiconducting material on or overlying a surface on a substrate 1106, and connecting a source 1108 and a drain 1110 of the memory device. In the embodiment shown, the device has a gate-all-around (GAA) structure in which the nanowire channel region 1102 is enclosed on all sides by a gate 1112 of the device. The thickness of the gate 1112 (measured in the direction from source to drain) determines the effective channel region length of the device.

In accordance with the present disclosure, the non-planar multigate memory device 1100 of FIG. 11A can include a split multi-layer charge-trapping region. FIG. 11B is a cross-sectional view of a portion of the non-planar memory device of FIG. 11A including a portion of the substrate 1106, nanowire channel region 1102 and the gate 1112 illustrating a split multi-layer charge-trapping region. Referring to FIG. 11B, the gate 1112 includes, in addition to a split multi-layer charge-trapping region, a tunnel dielectric layer 1114 overlying the nanowire channel region 1102, a blocking dielectric 1116 and a gate layer 1118 overlying the blocking layer to form a control gate of the memory device 1100. The gate layer 1118 can comprise a metal or a doped polysilicon.

The split multi-layer charge-trapping region includes at least a first deuterated layer 1120 overlying the tunnel dielectric layer 1114, an inner or first nitride layer 1122 or layer comprising nitride overlying the first deuterated layer 1120, and an outer or second nitride layer 1124 or layer comprising nitride overlying the first nitride layer 1122. Generally, the second nitride layer 1124 comprises a silicon-rich, oxygen-lean nitride layer and comprises a majority of a charge traps distributed in split multi-layer charge-trapping region, while the first nitride layer 1122 comprises an oxygen-rich nitride or silicon oxynitride, and is oxygen-rich relative to the second nitride layer 1124 to reduce the number of charge traps therein.

In some embodiments, such as that shown, the multi-layer charge-trapping region further includes at least one thin, intermediate oxide or anti-tunneling layer 1126 separating the second nitride layer 1124 from the first nitride layer 1122. As noted above, the anti-tunneling layer 1126 substantially reduces the probability of electron charge that accumulates at the boundaries of the second nitride layer 1124 during programming from tunneling into the first nitride layer 1122.

As with the embodiment described above, either or both of the first nitride layer 1122 and the second nitride layer 1124 can comprise silicon nitride or silicon oxynitride. The first nitride layer 1122 can be formed, for example, by a CVD process including $N_2O/NH_3$ and $DCS/NH_3$ gas mixtures in ratios and at flow rates tailored to provide a silicon-rich and oxygen-rich first nitride layer. The second nitride layer 1124 has a stoichiometric composition of oxygen, nitrogen and/or silicon different from that of the first nitride layer 1122, and may also be formed or deposited by a CVD process using a process gas including $DCS/NH_3$ and $N_2O/NH_3$ gas mixtures in ratios and at flow rates tailored to provide a silicon-rich, oxygen-lean second nitride layer.

In those embodiments including an anti-tunneling layer 1126 comprising oxide, the anti-tunneling layer can be formed by oxidation of the first nitride layer 1122, to a chosen depth using radical oxidation. Radical oxidation may be performed, for example, at a temperature of 1000-1100 degrees Celsius using a single wafer tool, or 800-900 degrees Celsius using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

In some embodiments, such as that shown, the multi-layer charge-trapping region 1014 further includes a second deuterated layer 1128 overlying the second nitride layer 1124 and separating the second nitride layer from the blocking dielectric layer 1116. As with embodiments described above, the second deuterated layer 1128 has a concentration of deuterium lower than a concentration of deuterium in the first deuterated layer 1120.

FIG. 11C illustrates a cross-sectional view of a vertical string or stack of non-planar devices 1100 of FIG. 11A arranged in a Bit-Cost Scalable or BiCS architecture 1130. The architecture 1130 consists of a vertical stack of non-planar devices 1100, where each device or cell includes a channel region 1102 overlying the substrate 1106, and connecting a source and a drain (not shown in this figure) of the memory device, and having a gate-all-around (GAA) structure in which the nanowire channel region 1102 is enclosed on all sides by a gate 1112. The BiCS architecture reduces number of critical lithography steps compared to a simple stacking of layers, leading to a reduced cost per memory bit.

Figure 12A:
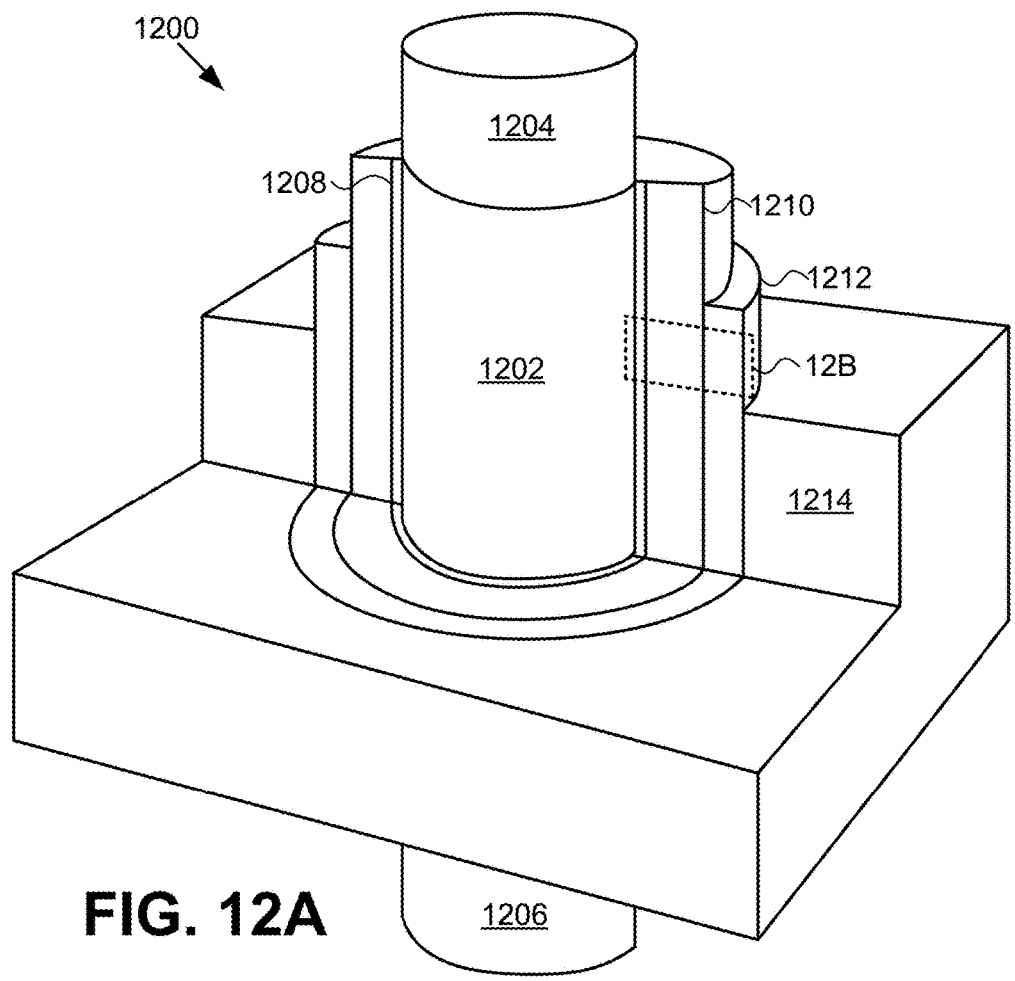
FIGS. 12A and 12B illustrate a non-planar multigate device including a split charge-trapping region and a vertical nanowire channel.

In another embodiment, the memory device is or includes a non-planar device comprising a vertical nanowire channel formed in or from a semiconducting material projecting above or from a number of conducting, semiconducting layers on a substrate. In one version of this embodiment, shown in cut-away in FIG. 12A, the memory device 1200 comprises a vertical nanowire channel region 1202 formed in a cylinder of semiconducting material connecting a source 1204 and drain 1206 of the device. The channel region 1202 is surrounded by a tunnel dielectric layer 1208, a multi-layer charge-trapping region 1210, a blocking layer 1212 and a gate layer 1214 overlying the blocking layer to form a control gate of the memory device 1200. The channel region 1202 can include an annular region in an outer layer of a substantially solid cylinder of semiconducting material, or can include an annular layer formed over a cylinder of dielectric filler material. As with the horizontal nanowires described above, the channel region 1202 can comprise polysilicon or recrystallized polysilicon to form a monocrystalline channel. Optionally, where the channel region 1202 includes a crystalline silicon, the channel can be formed to have <100> surface crystalline orientation relative to a long axis of the channel.

Figure 12B:
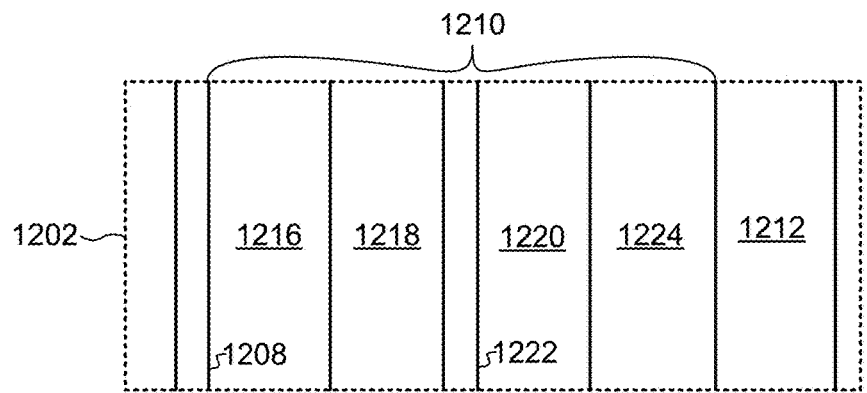

In some embodiments, such as that shown in FIG. 12B, the multi-layer charge-trapping region 1210 can be a split multi-layer charge-trapping region including at least a first deuterated layer 1216 overlying the tunnel dielectric layer 1208, an inner or first nitride layer 1218 or layer comprising nitride overlying the first deuterated layer 1216, and an outer or second nitride layer 1220 or layer comprising nitride overlying the first nitride layer 1218. Optionally, as in the embodiment shown the first and second nitride layers 1218, 1220, can be separated by an intermediate oxide or anti-tunneling layer 1222.

As with the embodiments described above, either or both of the first nitride layer 1218 and the second nitride layer 1220 can comprise silicon nitride or silicon oxynitride. The first nitride layer 1218 can be formed, for example, by a CVD process including $N_2O/NH_3$ and $DCS/NH_3$ gas mixtures in ratios and at flow rates tailored to provide a silicon-rich and oxygen-rich first nitride layer. The second nitride layer 1220 has a stoichiometric composition of oxygen, nitrogen and/or silicon different from that of the first nitride layer 1218, and may also be formed or deposited by a CVD process using a process gas including $DCS/NH_3$ and $N_2O/NH_3$ gas mixtures in ratios and at flow rates tailored to provide a silicon-rich, oxygen-lean second nitride layer.

In some embodiments, such as that shown, the multi-layer charge-trapping region 1210 further includes a second deuterated layer 1224 overlying the second nitride layer 1220 and separating the second nitride layer from the blocking dielectric layer 1212. As with embodiments described above, the second deuterated layer 1224 has a concentration of deuterium lower than a concentration of deuterium in the first deuterated layer 1216.

Thus, a nonvolatile charge trap memory device has been disclosed. The device includes a substrate having a channel region and a pair of source and drain regions. A gate stack is above the substrate over the channel region and between the pair of source and drain regions. In accordance with an embodiment of the present invention, the gate stack includes a multi-layer charge-trapping region having a first deuterated layer. In one embodiment, the multi-layer charge-trapping region further includes a deuterium-free charge-trapping layer. In an alternative embodiment, the multi-layer charge-trapping region includes a partially deuterated charge-trapping layer having a deuterium concentration less than that of the first deuterated layer.

What is claimed is:

1. A memory device comprising:
    a channel of semiconducting material overlying a surface of a substrate and electrically connecting a source and a drain;
    a tunnel dielectric layer surrounding the channel; and
    a multi-layer charge-trapping region surrounding the tunnel dielectric layer, the multi-layer charge-trapping region comprising a first deuterated layer overlying the tunnel dielectric layer, a first nitride-containing layer overlying the first deuterated layer, and a second nitride-containing layer overlying the first nitride-containing layer,
    wherein the first nitride-containing layer is deuterated and the second nitride-containing layer is deuterium-free, and
    wherein the first nitride-containing layer is substantially trap-free and the second nitride-containing layer includes a majority of charge traps distributed in the multi-layer charge-trapping region.

2. The memory device of claim 1, wherein the first deuterated layer comprises a deuterated derivative of a material used to form the first nitride-containing layer, and has a concentration of deuterium greater than the first nitride-containing layer.

3. The memory device of claim 1 wherein the second nitride-containing layer comprises an oxygen-lean nitride layer and the first nitride-containing layer comprises an oxygen-rich nitride layer.

4. The memory device of claim 1 wherein the channel comprises a long axis parallel to the surface of the substrate.

5. The memory device of claim 1 comprising a plurality of memory devices including channels having a long axis parallel to the surface of the substrate in a Bit-Cost Scalable (BiCS) architecture.

6. The memory device of claim 1 wherein the multi-layer charge-trapping region further comprises a second deuterated layer overlying the second nitride-containing layer.

7. The memory device of claim 6 wherein the second deuterated layer has a concentration of deuterium lower than a concentration of deuterium in the first deuterated layer.

8. The memory device of claim 6 wherein the first deuterated layer comprises a first deuterium gradient that decreases from a first deuterium concentration near the tunnel dielectric layer to a second deuterium concentration near the first nitride-containing layer, and the second deuterated layer comprises a second deuterium gradient that increases from a third deuterium concentration near the second nitride-containing layer to a fourth deuterium concentration near a top surface of the second deuterated layer.

9. A memory comprising:
    a vertical stack of non-planar memory devices, each non-planar memory device including:
        a channel of semiconducting material having a long axis parallel to a surface of a substrate;
        a tunnel dielectric layer overlying the channel on all sides thereof; and
        a multi-layer charge-trapping region overlying the tunnel dielectric layer, the multi-layer charge-trapping region comprising a first deuterated layer overlying the tunnel dielectric layer, a first nitride-containing layer overlying the first deuterated layer, and a second nitride-containing layer overlying the first nitride-containing layer,
    wherein the first nitride-containing layer is deuterated and the second nitride-containing layer is deuterium-free, and
    wherein the first nitride-containing layer is substantially trap-free and the second nitride-containing layer includes a majority of charge traps distributed in the multi-layer charge-trapping region.

10. The memory device of claim 9 wherein the multi-layer charge-trapping region further comprises a second deuterated layer overlying the second nitride-containing layer.

11. The memory device of claim 10 wherein the second deuterated layer has a concentration of deuterium lower than a concentration of deuterium in the first deuterated layer.

12. The memory device of claim 10 wherein the first deuterated layer comprises a first deuterium gradient that decreases from a first deuterium concentration near the tunnel dielectric layer to a second deuterium concentration near the first nitride-containing layer, and the second deuterated layer comprises a second deuterium gradient that increases from a third deuterium concentration near the second nitride-containing layer to a fourth deuterium concentration near a top surface of the second deuterated layer.

13. The memory device of claim 9, wherein the first deuterated layer comprises a deuterated derivative of a material used to form the first nitride-containing layer, and has a concentration of deuterium greater than the first nitride-containing layer.

14. A memory comprising:
    a vertical stack of non-planar memory devices, each non-planar memory device including:
        a channel of semiconducting material having a long axis parallel to a surface of a substrate;

a tunnel dielectric layer surrounding the channel;

a first deuterated layer overlying the tunnel dielectric layer;

a multi-layer charge-trapping region overlying the first deuterated layer, the multi-layer charge-trapping region comprising two or more nitride-containing layers including a first nitride-containing layer proximal to the first deuterated layer, and a second nitride-containing layer overlying the first nitride-containing layer; and a second deuterated layer overlying the second nitride-containing layer, wherein the first nitride-containing layer is deuterated and oxygen-rich, and the second nitride-containing layer comprises a deuterium-free, oxygen-lean nitride layer.

15. The memory device of claim 14 wherein the second deuterated layer has a concentration of deuterium lower than a concentration of deuterium in the first deuterated layer.

16. The memory device of claim 14 wherein the first deuterated layer comprises a first deuterium gradient that decreases from a first deuterium concentration near the tunnel dielectric layer to a second deuterium concentration near the first nitride-containing layer, and the second deuterated layer comprises a second deuterium gradient that increases from a third deuterium concentration near the second nitride-containing layer to a fourth deuterium concentration near a top surface of the second deuterated layer.

17. The memory device of claim 14, wherein the first deuterated layer comprises a deuterated derivative of a material used to form the first nitride-containing layer, and has a concentration of deuterium greater than the first nitride-containing layer.

* * * * *